(12) United States Patent
Manning

(10) Patent No.: US 6,496,440 B2
(45) Date of Patent: *Dec. 17, 2002

(54) METHOD AND SYSTEM FOR ACCESSING ROWS IN MULTIPLE MEMORY BANKS WITHIN AN INTEGRATED CIRCUIT

(75) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

This patent is subject to a terminal disclaimer.

(21) Appl. No.: 09/769,010

(22) Filed: Jan. 23, 2001

(65) Prior Publication Data

US 2001/0026497 A1 Oct. 4, 2001

Related U.S. Application Data

(63) Continuation of application No. 09/260,197, filed on Mar. 30, 1999.

(51) Int. Cl.[7] .................................................. G11C 8/00
(52) U.S. Cl. ......................... 365/230.03; 365/189.05; 365/230.08
(58) Field of Search ................... 365/230.03, 230.06, 365/230.08, 189.05, 233, 194

(56) References Cited

U.S. PATENT DOCUMENTS

| | | | |
|---|---|---|---|
| 5,652,733 A | 7/1997 | Chen et al. | 365/233 |
| 5,771,199 A | 6/1998 | Lee | 365/230.03 |
| 5,774,409 A | 6/1998 | Yamazaki et al. | 365/230.03 |
| 5,825,711 A | 10/1998 | Manning | 365/230.03 |
| 5,841,731 A | 11/1998 | Shinozaki | 365/233 |
| 6,032,220 A | 2/2000 | Martin et al. | 711/5 |
| 6,097,663 A | 8/2000 | Watanabe et al. | 365/230.03 |
| 6,178,133 B1 * | 1/2001 | Manning | 365/230.03 |
| 6,202,119 B1 | 3/2001 | Manning | 711/5 |
| 6,205,046 B1 * | 3/2001 | Maesako | 365/120 |
| 6,310,816 B2 * | 10/2001 | Manning | 365/230.03 |

* cited by examiner

Primary Examiner—Hoai Ho
Assistant Examiner—Gene N. Auduong
(74) Attorney, Agent, or Firm—Dorsey & Whitney LLP

(57) ABSTRACT

A row command unit is contained in an integrated circuit including a plurality of memory banks. The row command unit includes a plurality of row control latches, each row control latch having an output coupled to a respective memory bank and having an enable terminal and a control terminal. Each row control latch latches a signal applied on the control terminal when an active enable signal is applied on the enable terminal. A delay circuit has an output terminal coupled to the control terminals of the row control latches and has an input terminal. The delay circuit generates a row control signal on its output responsive to an activation signal applied on its input. A bank control circuit is coupled to the input terminal of the delay circuit and has input terminals adapted to receive respective bank address and bank control signals. The bank control circuit also has a plurality of output terminals, each output terminal being coupled to a respective enable terminal of one of the row control latches. The bank control circuit is operable to apply an active enable signal to one of the row control latches and to apply an active activation signal to the delay circuit responsive to the bank control and bank address signals. The row command unit may be contained in a packetized memory device including a plurality of memory banks coupled to respective row control latches. A row command unit according to one aspect of the present invention utilizes a reduced number of timing chain or delay circuits to access rows in a large number of memory banks.

16 Claims, 12 Drawing Sheets

| | CA9 | CA8 | CA7 | CA6 | CA5 | CA4 | CA3 | CA2 | CA1 | CA0 |
|---|---|---|---|---|---|---|---|---|---|---|
| PW1 | ID6 | ID5 | ID4 | ID3 | ID2 | ID1 | ID0 | CMD5 | CMD4 | CMD3 |
| PW2 | CMD2 | CMD1 | CMD0 | BNK2 | BNK1 | BNK0 | ROW9 | ROW8 | ROW7 | ROW6 |
| PW3 | ROW5 | ROW4 | ROW3 | ROW2 | ROW1 | ROW0 | 0 | 0 | 0 | 0 |
| PW4 | 0 | 0 | 0 | COL6 | COL5 | COL4 | COL3 | COL2 | COL1 | COL0 |

CA<0:39>

ID6–ID0 = DEVICE ID VALUE
CMD5–CMD0 = COMMAND CODE
BNK2–BNK0 = BANK ADDRESS

ROW9–ROW0 = ROW ADDRESS
COL6–COL0 = COLUMN ADDRESS
0 = UNUSED

*Fig. 2*
*(PRIOR ART)*

METHOD AND SYSTEM FOR ACCESSING ROWS IN MULTIPLE MEMORY BANKS WITHIN AN INTEGRATED CIRCUIT

CROSS-REFERENCE TO RELATED APPLICATION

This application is a continuation of pending U.S. patent application Ser. No. 09/260,197, filed Mar. 30, 1999.

TECHNICAL FIELD

The present invention relates generally to integrated circuits, and more specifically to a method and system including a reduced number of row command generators for accessing rows in a plurality of respective memory banks within a memory device.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a lower clock frequency that is substantially lower than the clock frequency of the processor. Similarly, the bus bridge allows the input devices, output devices, and data storage devices to operate at a substantially lower frequency. Currently, for example, a processor having a 300 MHz clock frequency may be mounted on a mother board having a 66 MHz clock frequency for controlling the system memory devices and other components.

Access to system memory is a frequent operation for the processor. The time required for the processor, operating, for example, at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as a synchronous link architecture. In the synchronous link architecture, the system memory may be coupled to the processor either directly through the processor bus or through a memory controller. Rather than requiring that separate address and control signals be provided to the system memory, synchronous link memory devices receive command packets that include both control and address information. The synchronous link memory device then outputs or receives data on a data bus that may be coupled directly to the data bus portion of the processor bus.

An example of a computer system 10 using the synchronous link architecture is shown in FIG. 1. The computer system 10 includes a processor 12 having a processor bus 14 coupled through a memory controller 18 and system memory bus 23 to three packetized or synchronous link dynamic random access memory ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 sends a data transfer command via the processor bus 14 to the memory controller 18, which, in turn, communicates with the memory devices 16a–c via the system memory bus 23 by sending the memory devices 16a–c command packets that contain both control and address information. Data are coupled between the memory controller 18 and the memory devices 16a–c through a data bus portion of the system memory bus 23. During a read operation, data are transferred from the SLDRAMs 16a–c over the memory bus 23 to the memory controller 18 which, in turn, transfers the data over the processor 14 to the processor 12. The processor 12 transfers write data over the processor bus 14 to the memory controller 18 which, in turn, transfers the write data over the system memory bus 23 to the SLDRAMs 16a–c. Although all the memory devices 16a–c are coupled to the same conductors of the system memory bus 23, only one memory device 16a–c at a time reads or writes data, thus avoiding bus contention on the memory bus 23. Bus contention is avoided by each of the memory devices 16a–c on the system memory 22 having a unique identifier, and the command packet contains an identifying code that selects only one of these components.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

A typical command packet CA<0:39> for an SLDRAM is shown in FIG. 2 and is formed by 4 packet words CA<0:9>, each of which contains 10 bits of data. As will be explained in more detail below, each packet word CA<0:9> is applied on a command address bus CA including 10 lines CA0–CA9. In FIG. 2, the four packet words CA<0:9> comprising a command packet CA<0:39> are designated PW1–PW4. The first packet word PW$_1$ contains 7 bits of data identifying the packetized DRAM 16a–c that is the intended recipient of the command packet. As explained below, each of the packetized DRAMs is provided with a unique ID code that is compared to the 7 ID bits in the first packet word PW$_1$. Thus, although all of the packetized DRAMs 16a–c will receive the command packet, only the packetized DRAM 16a–c having an ID code that matches the 7 ID bits of the first packet word PW$_1$ will respond to the command packet.

The remaining 3 bits of the first packet word PW$_1$ as well as 3 bits of the second packet word PW$_2$ comprise a 6 bit command. Typical commands are read and write in a variety of modes, such as accesses to pages or banks of memory cells. The remaining 7 bits of the second packet word PW$_2$ and portions of the third and fourth packet words PW$_3$ and PW$_4$ comprise a 20 bit address specifying a bank, row and column address for a memory transfer or the start of a multiple bit memory transfer. In one embodiment, the 20-bit address is divided into 3 bits of bank address, 10 bits of row address, and 7 bits of column address. Although the command packet shown in FIG. 2 is composed of 4 packet words PW1–PW4 each containing up to 10 bits, it will be understood that a command packet may contain a lesser or greater number of packet words, and each packet word may contain a lesser or greater number of bits.

The memory device 16a is shown in block diagram form in FIG. 3. Each of the memory devices 16a–c includes a clock generator circuit 40 that receives a command clock signal CCLK and generates a large number of other clock and timing signals to control the timing of various operations in the memory device 16a. The memory device 16a also includes a command buffer 46 and an address capture circuit 48 which receive an internal clock signal ICLK, a command packet CA<0:9> on a 10 bit command-address bus CA, and a terminal 52 receiving a FLAG signal. A memory controller (not shown) or other device normally transmits the command packet CA<0:9> to the memory device 16a in synchronism with the command clock signal CCLK. As explained above, the command packet, which generally includes four 10-bit packet words PW1–PW4, contains control and address information for each memory transfer. The FLAG signal identifies the start of a command packet, and also signals the start of an initialization sequence. The command buffer 46 receives the command packet from the conmmand-address bus CA, and compares at least a portion of the command packet to identifying data from an ID register 56 to determine if the command packet is directed to the memory device 16a or some other memory device 16b, c. If the command buffer 46 determines that the command is directed to the memory device 16a, it then provides the command to a command decoder and sequencer 60. The command decoder and sequencer 60 generates a large number of internal control signals to control the operation of the memory device 16a during a memory transfer.

The address capture circuit 48 also receives the command packet from the command-address bus CA and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70. The row and column addresses are processed by row and column address paths, as will be described in more detail below.

One of the problems of conventional DRAMs is their relatively low speed resulting from the time required to precharge and equilibrate circuitry in the DRAM array. The SLDRAM 16a shown in FIG. 3 largely avoids this problem by using a plurality of memory banks 80, in this case eight memory banks 80a–h. After a read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of a bank address from a bank address register 96.

The column address on bus 70 is applied to a column latch/decoder 100, which supplies I/O gating signals to an I/O gating circuit 102. The I/O gating circuit 102 interfaces with columns of the memory banks 80a–h through sense amplifiers 104. Data is coupled to or from the memory banks 80a–h through the sense amps 104 and I/O gating circuit 102 to a data path subsystem 108 which includes a read data path 110 and a write data path 112. The read data path 110 includes a read latch 120 that stores data from the I/O gating circuit 102.

In the memory device 16a shown in FIG. 3, 64 bits of data are stored in the read latch 120. The read latch then provides four 16-bit data words to an output multiplexer 122 that sequentially supplies each of the 16-bit data words to a read FIFO buffer 124. Successive 16-bit data words are clocked into the read FIFO buffer 124 by a clock signal RCLK generated from the internal clock signal ICLK. The 16-bit data words are then clocked out of the read FIFO buffer 124 by a clock signal obtained by coupling the RCLK signal through a programmable delay circuit 126. The programmable delay circuit 126 is programmed during initialization of the memory device 16a so that the data from the memory device is received by a memory controller, processor, or other device (not shown in FIG. 3) at the proper time. The FIFO buffer 124 sequentially applies the 16-bit data words to a driver circuit 128 which, in turn, applies the 16-bit data words to a data bus DQ forming part of the processor bus 14 (see FIG. 1). The driver circuit 128 also applies one of two data clock signals DCLK0 and DCLK1 to respective data clock lines 132 and 133. The data clocks DCLK0 and DCLK1 enable a device, such as the processor 12, reading the data on the data bus DQ to be synchronized with the data. Particular bits in the command portion of the command packet CA0–CA9 determine which of the two data clocks DCLK0 and DCLK1 is applied by the driver circuit 128. It should be noted that the data clocks DCLK0 and DCLK1 are differential clock signals, each including true and complementary signals, but for ease of explanation, only one signal for each clock is illustrated and described.

The write data path 112 includes a receiver buffer 140 coupled to the data bus 130. The receiver buffer 140 sequentially applies 16-bit data words from the data bus DQ to four input registers 142, each of which is selectively enabled by a signal from a clock generator circuit 144. The clock generator circuit 144 generates these enable signals responsive to the selected one of the data clock signals DCLK0 and DCLK1. The memory controller or processor determines which data clock DCLK0 or DCLK1 will be utilized during a write operation using the command portion of a command packet applied to the memory device 16a. As with the command clock signal CCLK and command packet, the memory controller or other device (not shown) normally transmits the data to the memory device 16a in synchronism with the selected one of the data clock signals DCLK0 and DCLK1. The clock generator 144 is programmed during initialization to adjust the timing of the clock signal applied to the input registers 142 relative to the selected one of the data clock signals DCLK0 and DCLK1 so that the input registers 142 can capture the write data at the proper times. In response to the selected data clock DCLK0 or DCLK1, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifiers 104.

As is well-known in the art, reading from a conventional memory bank in a DRAM requires that a selected row of memory cells corresponding to a row address first be activated. In activating a row, a pair of complementary digit lines for each column in the array are equilibrated. A word line coupled to each memory cell in the selected row is then activated, coupling each of the memory cells to a digit line for a respective column. A respective sense amplifier coupled to the complementary digit lines for each column is then able to sense, store, and collectively output the data stored in the selected row. These operations are performed responsive to internally generated "row commands", i.e., commands that activate an addressed row, then activate the sense amplifiers, and thereafter make the data stored in the row available for reading. Data provided by each of the sense amplifiers are then selected by a respective column address for coupling to an external data terminal through a data path. These operations are performed responsive to internally generated "column commands", i.e., commands that select and output data from a column. For example, in a synchronous DRAM, a row command may be received along with a row address and a row address strobe signal to activate or "open" the addressed row. A column command may then be received along with a column address and a column address strobe signal. For example, a page read command may cause data to be read from a sequence of columns of the open row starting at the column designated by the column address. Another row command may then be received, such as a command to deactivate or "close" the open row of memory cells.

In the packetized memory device 16a of FIG. 3, each of the memory banks 80a–h receives row control signals from the corresponding row latch/decoder/driver 82a–h to access a row of memory cells in that particular bank. Each of the row latch/decoder/driver circuits 82a–h typically includes a row address decoder that decodes the received row address and a driver or row command generator that generates row control signals to access a row corresponding to the decoded row address. More specifically, the row command generator typically generates a $\overline{\text{FIREROW}}$ signal for opening the row corresponding to the decoded row address and an $\overline{\text{NSENSE}}$ signal for activating the sense amplifiers coupled to the digit lines of the corresponding memory bank. A PSENSE signal may also be generated by the row generator and applied to activate PMOS transistors in the sense amplifier, as understood by one skilled in the art. In the following description, however, only the $\overline{\text{NSENSE}}$ signal will be described as activating the sense amplifier. As understood by one skilled in the art, the row command generator must activate the $\overline{\text{FIREROW}}$ and $\overline{\text{NSENSE}}$ signals at the proper times in order to open a row and accurately sense the data stored in the opened row. For example, in accessing a row the $\overline{\text{FIREROW}}$ signal is coupled to the word line corresponding to the selected row, coupling each of the memory cells in the selected row to the corresponding digit line as previously described. The row command generator thereafter activates the $\overline{\text{NSENSE}}$ signal, enabling the sense amplifiers to sense and store the data in the opened row of memory cells. The $\overline{\text{NSENSE}}$ signal should not be activated until each memory cell has been accessed, which includes being coupled to the corresponding digit line and transferring charge between the memory cell and the digit line. If the $\overline{\text{NSENSE}}$ signal is activated before each memory cell has been accessed, it is possible for the activated sense amplifiers to sense the wrong data, as will be understood by one skilled in the art. Similarly, when closing a row, the row command generator must deactivate the $\overline{\text{FIREROW}}$ signal and then deactivate the $\overline{\text{NSENSE}}$ signal a predetermined time later. Once again, the $\overline{\text{FIREROW}}$ signal must be deactivated sufficiently before the $\overline{\text{NSENSE}}$ signal is deactivated to ensure each of the memory cells is decoupled from the corresponding digit line before the sense amplifiers are deactivated, as will be understood by one skilled in the art.

The required timing of the $\overline{\text{FIREROW}}$ and $\overline{\text{NSENSE}}$ signals generated by each row command generator depends in part on the physical characteristics of word lines in the memory banks. For example, the resistance and capacitance of a word line affects the opening and closing of rows due to the resulting delay between activating or deactivating the word line in response to the $\overline{\text{FIREROW}}$ signal, and driving the voltage on the word line to a level sufficient to couple/decouple each memory cell to/from the corresponding digit line. Thus, in order to activate and deactivate the $\overline{\text{FIREROW}}$ and $\overline{\text{NSENSE}}$ signals at the proper times, each of the row command generators must include circuitry that emulates the timing of an actual word line. In other words, each row command generator must include a timing circuit that activates the $\overline{\text{NSENSE}}$ signal a predetermined time after the $\overline{\text{FIREROW}}$ signal, and deactivates the $\overline{\text{NSENSE}}$ signal a predetermined time after deactivating the $\overline{\text{FIREROW}}$ signal. Such timing circuits typically occupy a relatively large area on the substrate in which the memory device is formed due to the components required to accurately emulate the timing of the actual word lines and generate the $\overline{\text{FIREROW}}$ and $\overline{\text{NSENSE}}$ signals at the proper times. More specifically, each timing circuit typically includes a "dummy" word line or "mini array" component which is a word line formed crossing the same number of digit lines as an actual word line, thus occupying a relatively large area on the substrate, as understood by one skilled in the art. As the number of memory banks in a memory device increases, the area occupied by the corresponding row command generators may occupy an unacceptably large portion of the substrate in which the memory device is formed.

In memory devices including a plurality of memory banks, such as packetized memory devices like SLDRAMs, there is a need to reduce the area occupied by the row command generators utilized to access rows of memory cells in the respective banks. Although the above discussion is directed towards packetized memory devices such as SLDRAMs, the concepts apply to other types of integrated circuits as well, including other types of memory devices having multiple memory banks.

SUMMARY OF THE INVENTION

A row command unit is contained in an integrated circuit including a plurality of memory banks. The row command unit includes a plurality of row control latches, each row control latch having an output coupled to a respective memory bank, and having an enable terminal and a control terminal. Each row control latch latches a signal applied on the control terminal when an active enable signal is applied on the enable terminal. A delay circuit has an output terminal coupled to the control terminals of the row control latches. The delay circuit also has an input terminal and generates a row control signal on its output responsive to an activation signal applied on its input. A bank control circuit is coupled to the input terminal of the delay circuit and has input terminals adapted to receive respective bank address and bank control signals. The bank control circuit also has a plurality of output terminals, each output terminal being coupled to a respective enable terminal of one of the row control latches. The bank control circuit applies an active enable signal to one of the row control latches and applies an active activation signal to the delay circuit responsive to the bank control and bank address signals.

According to a second aspect of the present invention, the row command unit is contained in a packetized memory device including a plurality of memory banks coupled to respective row control latches, and having a minimum bank-to-bank access time $t_1$ between which successive banks may be accessed. Each of the row-timing circuits includes an open-row and close-row timing circuit, each having a delay-reset time of $t_2$. The number of row-timing circuits contained in the packetized memory device corresponds to $t_2/t_1$ rounded up to the nearest integer. One skilled in the art will appreciate that although the row command unit is described as being contained in a packetized memory device, the row command unit may be contained in any type of integrated circuit having a plurality of memory banks, including other types of memory devices, such as conventional asynchronous DRAMs.

BRIEF DESCRIPTION OF THE DRAWINGS

FIG. 2 is a diagram showing a typical command packet applied to the packetized memory devices of FIG. 1.

DETAILED DESCRIPTION OF THE INVENTION

Figure 3:
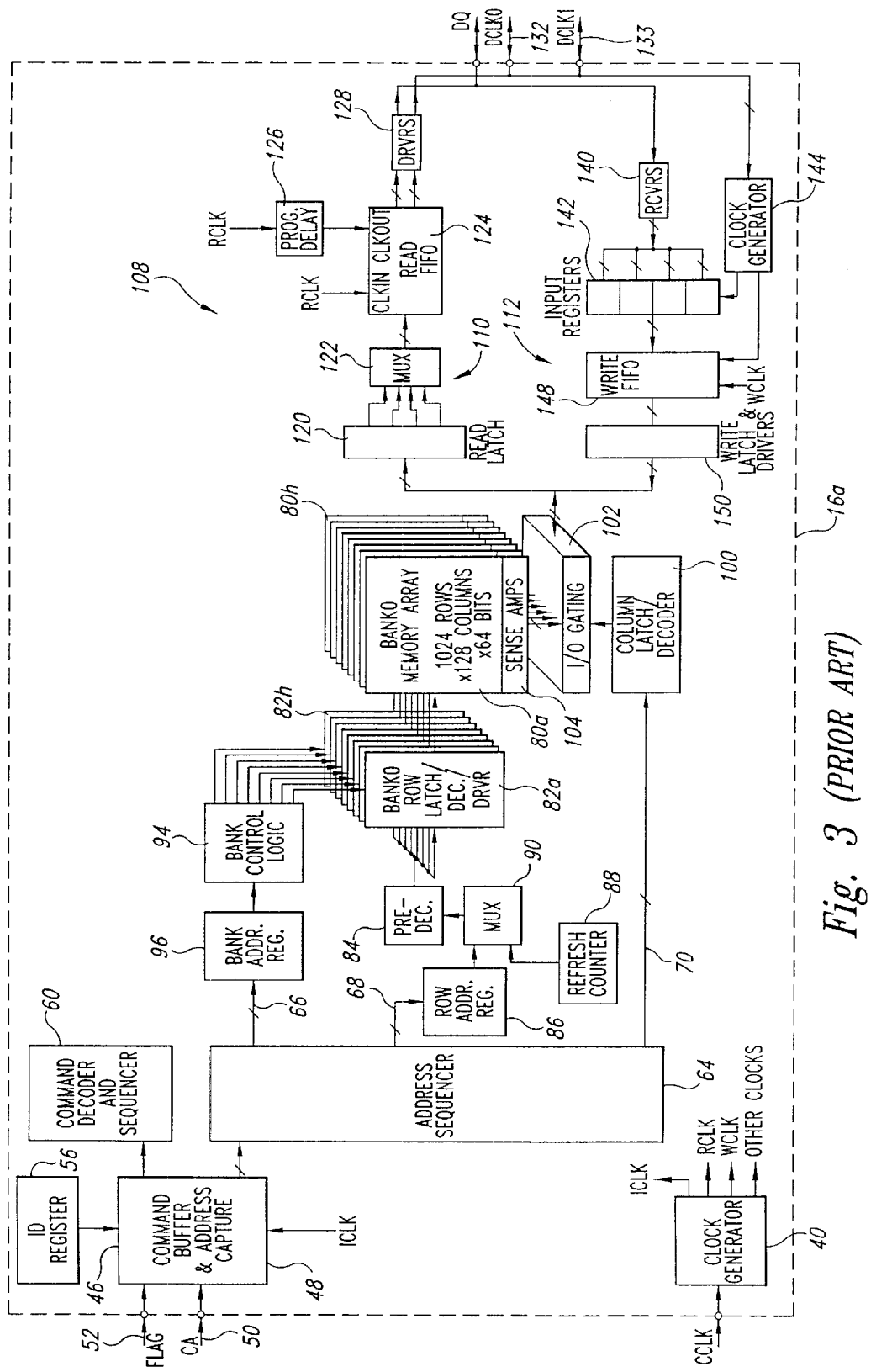
FIG. 3 is a block diagram of a packetized memory device that may be used in the computer system of FIG. 1.
Figure 4:
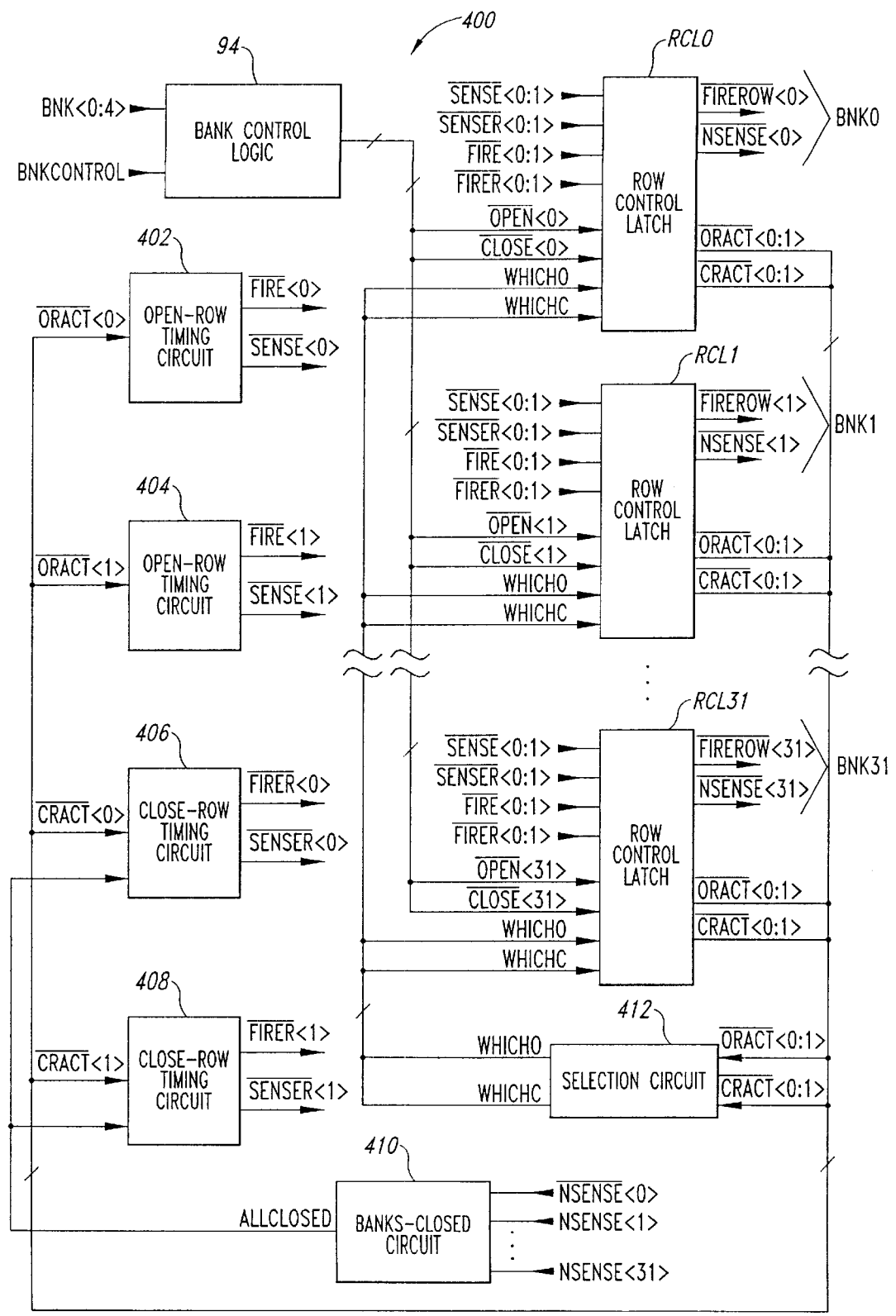
FIG. 4 is a block diagram of a row command unit according to one embodiment of the present invention that may be utilized in the packetized memory device of FIG. 3.

FIG. 4 is a block diagram of a row command unit 400 according to one embodiment of the present invention. The row command unit 400 may be utilized in place of row command units contained in the latch/decoder/drivers 82*a–h* of the packetized memory device 16*a* of the FIG. 3. In operation, the row command unit 400 generates row control signals to open and close rows in a plurality of respective memory banks (not shown in FIG. 4) utilizing a predetermined number of timing circuits that is less than the number of memory banks, as will be described in more detail below.

The row command unit 400 includes a plurality of row control latches RCL0–RCL31 that are coupled to respective memory banks BNK0–BNK31 (not shown in FIG. 4). The row control latches RCL0–RCL31 apply respective row access signals $\overline{\text{FIREROW}}$ <0:31> and sense amplifier control signals $\overline{\text{NSENSE}}$ <0:31> to open and close rows in the corresponding memory banks BNK0–BNK31, as will be described in more detail below. Each of the row control latches RCL0–RCL31 receives respective open and close bank address signals $\overline{\text{OPEN}}$ <0:31> and $\overline{\text{CLOSE}}$ <0:31> from the bank control logic 94 previously described with reference to FIG. 3. The bank control logic 94 controls the $\overline{\text{OPEN}}$ <0:31> and $\overline{\text{CLOSE}}$ <0:31> in response to a bank control signal BNKCONTROL and a 5-bit bank address BNK<0:4> received from other circuitry (not shown in FIG. 4) in the packetized memory device 16*a* containing the row command unit 400. The BNK<0:4> address corresponds to which one of the 32 memory banks is being addressed, and the BNKCONTROL signal determines whether the addressed bank is being opened or closed (i.e., whether a row within the addressed bank is being opened or closed). For example, when BNK1 is being addressed, the BNK<0:4> address equals 00001 and the bank control logic 94 activates either the $\overline{\text{OPEN}}$ <1> or $\overline{\text{CLOSE}}$ <1> signals depending on the state of the BNKCONTROL signal. A respective row control latch RCL0–RCL31 receiving either an active $\overline{\text{OPEN}}$ <0:31> or $\overline{\text{CLOSE}}$ <0:31> signal from the bank control logic 94 may hereinafter be referred to as a "selected" row control latch.

The row command unit 400 further includes two open-row timing circuits 402 and 404 that generate respective open row signals $\overline{\text{FIRE}}$ <0:1> and sense amplifier activation signals $\overline{\text{SENSE}}$ <0:1> in response to respective open row activation signals $\overline{\text{ORACT}}$ <0:1> received from the row control latches RCL0–RCL31. Although each of the row control latches RCL0–RCL31 generates the $\overline{\text{ORACT}}$ <0:1> signals, only one selected row control latch RCL0–RCL31 activates the $\overline{\text{ORACT}}$ <0> signal at a time, and only one selected row control latch RCL0–RCL31 activates the $\overline{\text{ORACT}}$ <1> signal at a time, as will be explained in more detail below. The open-row timing circuits 402 and 404 operate identically in response to the $\overline{\text{ORACT}}$ <0> and $\overline{\text{ORACT}}$ <1> signals, and thus, for the sake of brevity, only the circuit 402 will be described in further detail. The open-row timing circuit 402 activates the $\overline{\text{FIRE}}$ <0> signal a first time after receiving the $\overline{\text{ORACT}}$ <0:1> signal, and thereafter activates the $\overline{\text{SENSE}}$ <0> signal a second time after activating the $\overline{\text{FIRE}}$ <0> signal. Once the open-row timing circuit 402 has activated the $\overline{\text{SENSE}}$ <0> signal, it resets itself to thereby precharge various circuitry within the timing circuit in anticipation of receiving a subsequent active $\overline{\text{ORACT}}$ <0> signal, as will be explained in more detail below.

A pair of close-row timing circuits 406 and 408 operate in a manner analogous to the open-row timing circuits 402 and 404 to apply respective close row signals $\overline{\text{FIRER}}$ <0> and $\overline{\text{FIRER}}$ <1> and sense amplifier deactivation signals $\overline{\text{SENSER}}$ <0> and $\overline{\text{SENSER}}$ <1> to the row control latches RCL0–31 responsive to corresponding close row activation signals $\overline{\text{CRACT}}$ <0:1>. For example, the close-row timing circuit 406 activates the $\overline{\text{FIRER}}$ <0> signal a first time after the $\overline{\text{CRACT}}$ <0> signal goes active, and thereafter activates the $\overline{\text{SENSER}}$ <0> signal a second time after activating the $\overline{\text{FIRER}}$ <0> signal, and the circuit 406 resets responsive to activating the $\overline{\text{FIRER}}$ <0> signal.

The row command unit 400 further includes a selection circuit 412 receiving the $\overline{\text{ORACT}}$ <0:1> and $\overline{\text{CRACT}}$ <0:1> signals from the row control latches RCL0–RCL31 and generating an open selection signal WHICHO and a close selection signal WHICHC in response to these signals. More specifically, when either of the $\overline{\text{ORACT}}$ <0> or $\overline{\text{ORACT}}$ <1> signals goes active, the selection circuit 412 complements the value of previous WHICHO signal. For example, if the WHICHO signal is high, the selection circuit 412 drives that signal low when either of the $\overline{\text{ORACT}}$ <0> or $\overline{\text{ORACT}}$ <1> signals goes active. Similarly, when either of the $\overline{\text{CRACT}}$ <0> or $\overline{\text{CRACT}}$ <1> signals goes active, the selection circuit complements the value of the previous WHICHC signal. As will be explained in more detail below, the WHICHO signal determines which one of the $\overline{\text{ORACT}}$ <0> or $\overline{\text{ORACT}}$ <1> signals is activated by a selected row control latch RCL0–RCL31 receiving the corresponding active $\overline{\text{OPEN}}$ <0:31> signal, and the WHICHC signal determines which one of the $\overline{\text{CRACT}}$ <0> or $\overline{\text{CRACT}}$ <1> signals is activated by a selected row control latch RCL0–RCL31 receiving the corresponding active $\overline{\text{CLOSE}}$ <0:31> signal. In the embodiment of FIG. 4, the selection circuit 412 need only generate one WHICHO and one WHICHC signal, since there are only two open-row timing currents 402,404 and two close-row timing circuits 406,408 (i.e., one binary WHICHO signal can select the two circuits 402,404). More generally, the selection circuit 412 generates the number of WHICHO and WHICHC signals required to activate N open-row timing circuits and N close-row timing circuits, respectively, as will be understood by one skilled in the art.

The row command unit further includes a banks-closed circuit 410 the applies an ALLCLOSED signal to each of the close-row timing circuits 406 and 408. When the $\overline{\text{NSENSE}}$ <0:31> signals are all inactive high, indicating none of the memory banks BNK0–BNK31 is open, the banks-closed circuit 410 activates the ALLCLOSED signal, placing the close-row timing circuits 406 and 408 in a low power mode of operation. In one embodiment, the banks-closed circuit 410 is merely a NOR gate having respective inputs coupled to receive the $\overline{\text{NSENSE}}$ <0:31> signals and developing the ALLCLOSED signal on its output.

In operation, when the bank control logic 94 activates one of the $\overline{\text{OPEN}}$ <0:31> or $\overline{\text{CLOSE}}$ <0:31> signals, the corresponding row control latch RCL0–31 activates the selected one of the open-row timing circuits 402 and 404 or close-row timing circuits 406 and 408 and thereafter latches the signals generated by the selected one of the timing circuits 402–408 to thereby open or close a row in the corresponding bank, as will now be described in more detail. Initially, assume the selection circuit 412 drives both the WHICHO and WHICHC signals active, and that the row control latches RCL0–31 latch the $\overline{\text{FIREROW}}$ <0:31> and $\overline{\text{NSENSE}}$ <0:31> signals inactive high so that there are no open rows in any of the memory banks BNK0–BNK31. At this point, assume that the memory controller 18 (FIG. 1) applies a bank read command to the packetized memory device 16a containing the row command unit 400. As previously described, a bank read command includes bank, row, and column address portions, and causes a row in the bank corresponding to the bank address to be opened and data to thereafter be read from a sequence of columns in the opened row. In response to the bank read command, the bank control logic 94 receives the bank address BNK<0:4> corresponding to the bank address portion of the bank read command, and receives an active BNKCONTROL signal from the command decoder and sequencer 60 (FIG. 3) indicating that a row in the designated bank is to be opened. In the following description, assume that the bank address BNK<0:4> equals 00001, indicating that a row in memory bank BNK1 corresponding to the row address in the applied bank read command is to be opened.

In response to the active BNKCONTROL signal and the applied BNK<0:4> address, the bank control logic 94 activates the $\overline{\text{OPEN}}$ <1> signal applied to the row control latch RCL1. When the $\overline{\text{OPEN}}$ <1> signal goes active, the row control latch RCL1 operates in the open-row mode of operation and latches the active WHICHO signal from the selection circuit 412. In response to the latched WHICHO signal, the row control latch RCL1 performs three operations. First, when the WHICHO signal is active the row control latch RCL1 couples the $\overline{\text{FIRE}}$ <0> and $\overline{\text{SENSE}}$ <0> signals from the open-row timing circuit 402 to respective latch circuits (not shown in FIG. 4) in the row control latch RCL1. Conversely, when the WHICHO signal is inactive the row control latch RCL1 couples the $\overline{\text{FIRE}}$ <1> and $\overline{\text{SENSE}}$ <1> signals from the open-row timing circuit 404 to the respective latch circuits.

The second operation performed by the row control latch RCL1 in response to the latched value of the WHICHO signal is activating one of the $\overline{\text{ORACT}}$ <0:1> signals to thereby activate the corresponding open-row timing circuit 402,404. When the WHICHO signal is active, the row control latch RCL1 activates the $\overline{\text{ORACT}}$ <0> signal, activating the open-row timing circuit 402, and when the WHICHO signal is inactive the row control latch RCL1 activates the $\overline{\text{ORACT}}$ <1> signal. In this way, the row control latch RCL1 activates the open-row timing circuit 402,404 that is coupled to its internal latch circuits enabling the row control latch RCL1 to latch the $\overline{\text{FIRE}}$ <0:1>, $\overline{\text{SENSE}}$ <0:1> signals generated by this timing circuit, as will be explained in more detail below. For example, when the WHICHO signal is active, the row control latch RCL1 activates the $\overline{\text{ORACT}}$ <0> signal to thereby activate the open-row timing circuit 402. Finally, the third operation performed by the row control latch RCL1 in response to the value of the latched WHICH0 signal is isolating the $\overline{\text{FIRE}}$ <1>, $\overline{\text{SENSE}}$ <1> signals from the open-row timing circuit 404 as well as the $\overline{\text{FIRER}}$ <0:1>, $\overline{\text{SENSER}}$ <0:1> signals from the close-row timing circuits 406 and 408. In other words, the row control latch RCL1 isolates all signals from the timing circuits 404–408 that are not being used by the row control latch RCL1, enabling these signals to be utilized by the other row control latches RCL0 and RCL2–31. In the following description, when a selected one of the row control latches RCL0–31 couples the signals generated by one of the timing circuits 402–408 to internal latches as previously described, may be referred to merely as the selected row control latch "attaching" to the selected one of the timing circuits 402–408 to simplify the following description.

Figure 1:
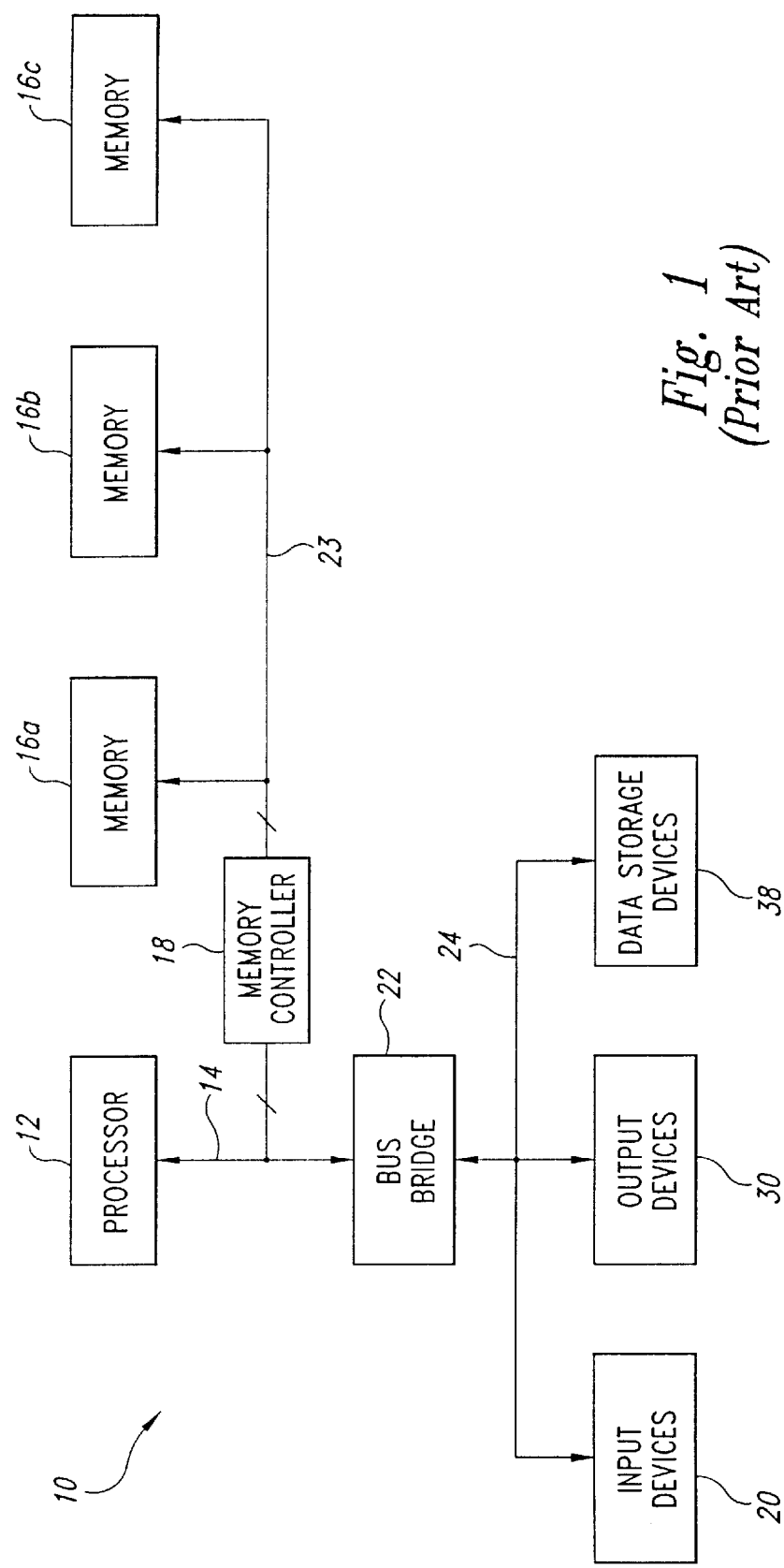
FIG. 1 is a block diagram of a computer system using the SLDRAM packetized memory device architecture.

In response to the row control latch RCL1 activating the $\overline{\text{ORACT}}$ <0> signal, the open-row timing circuit 402 operates as previously described to activate the $\overline{\text{FIRE}}$ <0> signal a predetermined time after receiving the active $\overline{\text{ORACT}}$ <0> signal. When the open-row timing circuit 402 drives the $\overline{\text{FIRE}}$ <0> signal active low, the row control latch RCL1 latches the $\overline{\text{FIREROW}}$ <1> signal active low thereby opening the row of memory cells in memory bank BNK1 corresponding to the row address portion of the applied bank read command. At this point, the $\overline{\text{NSENSE}}$ <1> signal from the row control latch RCL1 remains inactive high so that the sense amplifiers coupled to the digit lines of memory bank BNK1 are not activated until the memory cells in the activated row have fully transferred their charge to the corresponding digit lines, as previously described. The second predetermined time after activating the $\overline{\text{FIRE}}$ <0> signal, the open-row timing circuit 402 drives the $\overline{\text{SENSE}}$ <0> signal active low. When the $\overline{\text{SENSE}}$ <0> signal goes active low, the row control latch RCL1 latches the $\overline{\text{NSENSE}}$ <1> signal active low thereby activating the sense amplifiers coupled to memory bank BNK1. At this point, column address circuitry transfers data from columns in the open row corresponding to the column address portion of the applied bank read command, and this data is thereafter transferred out of the packetized memory device 16a containing the row command unit 400 where it is available to be read by the memory controller 18 (FIG. 1). Once the timing circuit 402 activates the $\overline{\text{SENSE}}$ <0> signal, it resets itself as previously described, and may not again be triggered until reset. In addition, it should be noted that when the row control latch RCL1 latches the $\overline{\text{NSENSE}}$ <1> signal active low, the row control latch RCL1 "detaches" itself from the open-row timing circuit 402. In other words, the row control latch RCL1 has now latched the $\overline{\text{FIREROW}}$ <1> and $\overline{\text{NSENSE}}$ <1> signals active responsive to the respective $\overline{\text{FIRE}}$ <0> and $\overline{\text{SENSE}}$ <0> signals from the open-row timing circuit 402, and thereafter isolates these signals from circuitry within the row control latch RCL1 so the open-row timing circuit 402 may thereafter be attached to another row control latch RCL0 and RCL2–RCL31 to open a row in the corresponding memory banks BNK0 and BNK2–BNK31 in the same way.

At this point, the open row in memory bank BNK1 may either be closed or remain open for future page access data transfer operations. In the following example, it is assumed the bank read command was of the type that the open row is to be closed after the addressed data has been read from that addressed row, and the operation of the row command unit 400 in closing the open row in memory bank BNK1 will now be described in more detail. When the open row in the memory bank BNK1 is to be closed, the bank address BNK<0:4> applied to the bank control logic 94 remains 00001 as described above, and the command decoder and sequencer 60 (FIG. 3) deactivates the BNKCONTROL signal applied to the bank control logic 94. When the BNKCONTROL signal goes inactive, the bank control logic 94 pulses the $\overline{\text{CLOSE}}$ <1> signal active low. When the $\overline{\text{CLOSE}}$ <1> signal goes active low, the row control latch RCL1 operates in the close-row mode of operation and latches the WHICHC signal from the selection circuit 412. As previously described, the value of the WHICHC signal determines which one of the close-row timing circuits 406 and 408 is attached to the row control latch RCL1. When the WHICHC signal is active, the row control latch RCL1 attaches to the close-row timing circuit 406.

Once the row control latch RCL1 has attached to the close-row timing circuit 406, the row control latch activates the $\overline{\text{CRACT}}$ <0> signal thereby activating the close-row timing circuit 406. As previously described, the close-row timing circuit 406 operates in a manner analogous to the open-row timing circuits 402 and 404. Thus, the close-row timing circuit 406 drives the $\overline{\text{FIRER}}$ <0> signal active low a first time after the $\overline{\text{CRACT}}$ <0> signal goes active, and thereafter drives the $\overline{\text{SENSER}}$ <0> signal active low a second time after the $\overline{\text{FIRER}}$ <0> signal goes active. When the $\overline{\text{FIRER}}$ <0> signal goes active low, the row control latch RCL1 latches the $\overline{\text{FIREROW}}$ <1> signal inactive high thereby closing the previously open row in memory bank BNK1. Similarly, when the close-row timing circuit 406 drives the $\overline{\text{SENSER}}$ <0> signal active low the second time later, the row control latch RCL1 latches the $\overline{\text{NSENSE}}$ <1> signal inactive high, deactivating the sense amplifiers coupled to the digit lines of the memory bank BNK1. During the close-row mode of operation, once the row control latch RCL1 latches the $\overline{\text{NSENSE}}$ <1> signal inactive high, the row control latch detaches itself from the one of the close-row timing circuits 406.

The row command unit 400 operates in the manner described for the row control latch RCL1 to open and close rows in any of the memory banks BNK0–BNK31. During normal operation of the memory device 16a containing the command unit 400, the bank control logic 94 sequentially activates respective $\overline{\text{OPEN}}$ <0:31> and $\overline{\text{CLOSE}}$ <0:31> signals responsive to data transfer commands applied to the memory device 16a. For example, the bank control logic 94 may activate the $\overline{\text{OPEN}}$ <31> signal, causing the latch RCL31 to attach to one of the open-row timing circuits 402,404 and thereby latch the $\overline{\text{FIREROW}}$ <31>, $\overline{\text{NSENSE}}$ <31> signals active to open the addressed row in bank BNK31. While the row control latch RCL31 is attached to one of the open-row timing circuits 402,404, the bank control logic 94 may activate either the $\overline{\text{OPEN}}$ <0:30> or $\overline{\text{CLOSE}}$ <0:30> signal applied to another row control latch RCL0–RCL30 to open or close a row in the corresponding memory bank BNK0–BNK30. For example, assume the row control latch RCL31 is attached to the open-row timing circuit 402, and the bank control logic 94 thereafter activates the $\overline{\text{OPEN}}$ <0> signal. In this situation, the value of the WHICH0 signal from the selection circuit causes the row control latch RCL0 to attach to the open-row timing circuit 404 responsive to the active $\overline{\text{OPEN}}$ <0> signal, which may occur while the latch RCL31 is still attached to the timing circuit 402.

To ensure proper operation of the row command unit 400, there must be a sufficient number of timing circuits 402–408 to handle consecutive bank accesses. The minimum number of timing circuits is determined by two factors, a minimum bank-to-bank access time and the cycle time of each of the timing circuits. The minimum bank-to-bank access time corresponds to the minimum time between consecutive bank accesses, where a bank access is either opening or closing a row in a respective bank. As previously described, the cycle time of each timing circuit 402–408 corresponds to the maximum time from the timing circuit being activated until that same timing circuit has been reset and is therefore ready to be activated once again. For example, the cycle time of the open-row timing circuit 402 corresponds to the maximum time from when the $\overline{ORACT}$ <0> signal goes active until that timing circuit has reset itself in response to driving the $\overline{SENSE}$ <0> signal active low. The minimum number of required timing circuits is given by the cycle time of each timing circuit divided by the minimum bank-to-bank access time, rounded up to the nearest integer and then multiplied by 2 to account for both open and close row accesses.

For example, assume there are the thirty-two memory banks BNK0–BNK31 and the minimum bank-to-bank access time equals 20 nanoseconds (ns). Further assume the maximum cycle time for each of the timing circuits equals 25 ns. In this example, 25 ns divided by 20 ns equals 1.25, which is then rounded up to 2 and thereafter multiplied by 2 for a total of 4 timing circuits, 2 open-row timing circuits and 2 close-row timing circuits. The timing circuits 402–408 thus ensure that one timing circuit is available for consecutive bank accesses every 20 ns when the cycle time of each timing circuit is 25 ns. For example, if the open-row timing circuit 402 is activated at a time t1 then the open-row timing circuit 404 may be activated as soon as t1+20 ns. The open-row timing circuit 402 will be reset at t1+25 ns, and thus if another open bank access is received at t1+40 ns (i.e., t1+20 ns+minimum bank-to-bank access time), the timing circuit 402 is reset and ready to attach and handle this access. It should be noted that in this example, the 2 open-row timing circuits and 2 close-row timing circuits may be utilized to open and close rows in any number of memory banks as long as the minimum bank-to-bank access time and cycle time for each of the timing circuits remain the same.

One skilled in the art will realize that the row command unit 400 of FIG. 4 is merely one embodiment of a row command unit according to one aspect of the present invention, and that many other alternative embodiments may be realized within the scope of the present invention. For example, in the row command unit 400 the bank control logic 94 could include circuitry to perform functions performed by the selection circuit 412 and row control latches RCL0–RCL31. More specifically, the bank control logic 94 could select one of the timing circuits 402–408 responsive to the BNKCONTROL signal, couple the selected timing circuit to the row control latch RCL0–RCL31 determined by the BNK<0:4> address, and thereafter activate the selected timing circuit and decouple the selected timing circuit from the row control latch once the row control signals from the selected timing circuit have been latched. In such an embodiment, where there are two open-row timing circuits 402, 404 and two close-row timing circuits 406, 408, the bank control logic 94 would merely alternately select each of the open-row timing circuits and each of the close-row timing circuits.

In alternative embodiments, where there are a greater number of both open-row and close-row timing circuits, the bank control logic 94 could sequentially select the timing circuits. For example, assume there are five open-row timing circuits and five close-row timing circuits. When a first open row command (i.e., active BNKCONTROL signal and the corresponding BNK<0:4> address) is received, the control logic 94 could select the first open-row timing circuit, and then the second open-row timing circuit when the next open row command is received, and so on. The first open-row timing circuit would once again be selected after the fifth open-row timing circuit was selected immediately prior. In such an embodiment the bank control logic 94 could select the five close-row timing circuits in the same manner. The circuitry in the bank control logic 94 for performing these and other functions within this aspect of present invention will be understood by those skilled in the art.

The row command unit 400 enables a reduced number of timing circuits to be utilized in opening and closing rows in a much greater number of memory banks. In the embodiment of FIG. 4, the four timing circuits 402–408 are utilized to open and close rows in the thirty-two memory banks BNK0–BNK31. In contrast, in a conventional row command unit there must be an individual timing circuit for each of the memory banks. Thus, a conventional row command unit would require sixty-four timing circuits to open and close rows in the memory banks BNK0–BNK31, and, as previously described, each of these timing circuits occupies a relatively large area of the substrate in which the packetized memory device containing the row command unit is formed. In contrast, the row command unit 400 enables only four timing circuits 402–408 to be utilized in opening and closing rows in the memory banks BNK0–BNK31. It should be noted that although the row command unit 400 has been described as being contained in a packetized memory device 16a, such as an SLDRAM, the row command unit 400 may be contained in any type of integrated circuit having a plurality of memory banks, including other types of memory devices, such as conventional asynchronous DRAMs.

Figure 5:
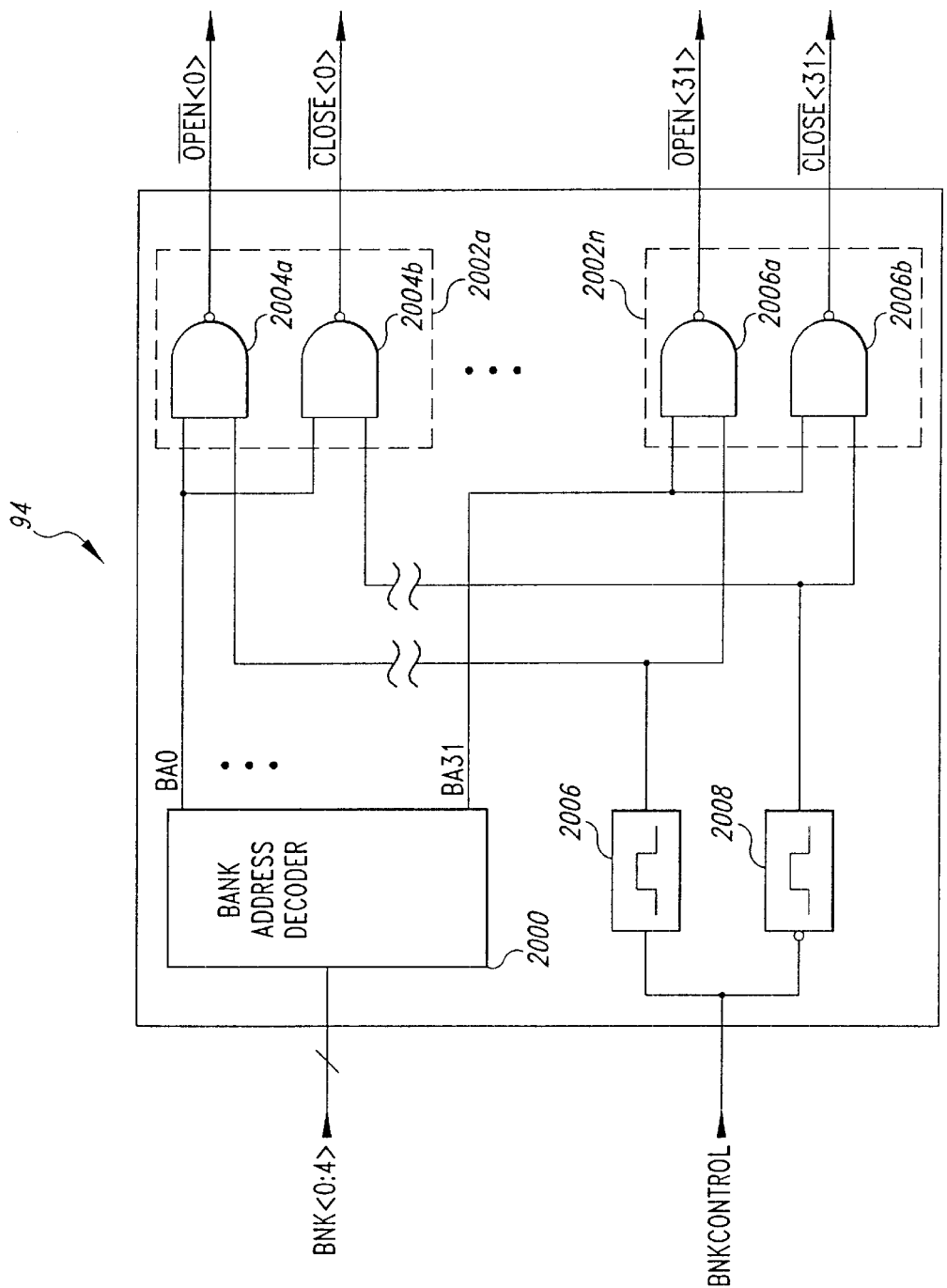
FIG. 5 is a functional block diagram of the bank control logic of FIG. 4 according to one embodiment of the present invention.

FIG. 5 is a functional block diagram of the bank control logic 94 of FIG. 4 according to one embodiment of the present invention. The bank control logic 94 includes a bank address decoder 2000 that receives the bank address BNK<0:4> and activates one of a plurality of decoded bank address signals BA0–BA31 in response to the value of the received BNK<0:4> address. For example, when the BNK<0:4> address equals 00000 the decoder 2000 activates the BA0 signal. The BA0–BA31 signals are applied to a plurality of logic circuits 2002a–n, respectively, each of the logic circuits 2002a–n generating a corresponding pair of the $\overline{OPEN}$ <0:31> and $\overline{CLOSE}$ <0:31> signals in response to pulses generated by a pair of pulse generators 2006 and 2008, as will be explained in more detail below. The pulse generator 2006 generates a pulse on its output in response to a rising-edge transition of BNKCONTROL signal, and the pulse generator 2008 generates a pulse on its output in response to a falling-edge transition of the BNKCONTROL signal.

Each of the logic circuits 2002a–n includes two NAND gates, the NAND gates 2004a–b and 2006a–b being shown for the logic circuits 2002a and 2002n, respectively. In the logic circuit 2002a, the NAND gates 2004a and 2004b are enabled by the BA0 signal applied on respective inputs. When the BA0 signal is active high, enabling the NAND gates 2004a and 2004b, the NAND gate 2004a generates the $\overline{OPEN}$ <0> signal responsive to the pulse from the pulse generator 2006, and the NAND gate 2004b generates the $\overline{CLOSE}$ <0> signal responsive to the pulse from the pulse generator 2008. In the logic circuit 2002n, the NAND gate 2006a generates the $\overline{OPEN}$ <31> signal on its output in response to a pulse from the pulse generator 2006, and the NAND gate 2006b generates the $\overline{CLOSE}$ <31> signal on its output in response to a pulse from the pulse generator 2008. In this way, when each of the logic circuits 2002a–n is enabled by the corresponding BA0–BA31 signal, the logic circuit generates the corresponding $\overline{\text{OPEN}}$ <0:31> signal in response to a pulse from the pulse generator 2006, which occurs when the BNKCONTROL signal goes high, and generates the corresponding one of the $\overline{\text{CLOSE}}$ <0:31> signals responsive to a pulse from the pulse generator 2008, which occurs when the BNKCONTROL signal goes low.

In operation, a bank address BNK<0:4> signal is applied to the decoder 2000 which, in turn, decodes the applied bank address and activates one of the BA0–BA31 signals corresponding to the value of the applied bank address. In the following example, assume the BNK<0:4> address equals 00000, causing the decoder to activate the BA0 signal. When the BA0 signal goes active high, the NAND gates 2004a, b are enabled. The BNKCONTROL signal thereafter goes either high or low depending upon whether a row in the memory bank BNK0, which corresponds to the applied BNK<0:4> address, is to be opened or closed. When a row is to be opened, the BNKCONTROL signal goes high causing the pulse generator 2006 to apply a high pulse to the NAND gate 2004a. In response to the high pulse from the pulse generator 2006, the NAND gate 2004a drives the $\overline{\text{OPEN}}$ <0> signal active low to thereby cause the addressed row in the memory bank BNK0 to be opened. When a row is to be closed, the BNKCONTROL signal goes low causing the pulse generator 2008 to apply a high pulse to the NAND gate 2004b which, in turn, drives the $\overline{\text{CLOSE}}$ <0> signal active low closing a row in the memory bank BNK0 as previously described. FIG. 5 is merely a sample embodiment of the bank control logic 94, and other circuitry understood by those skilled in the art may be utilized to perform the required functions of the bank control logic 94.

Figure 6A:
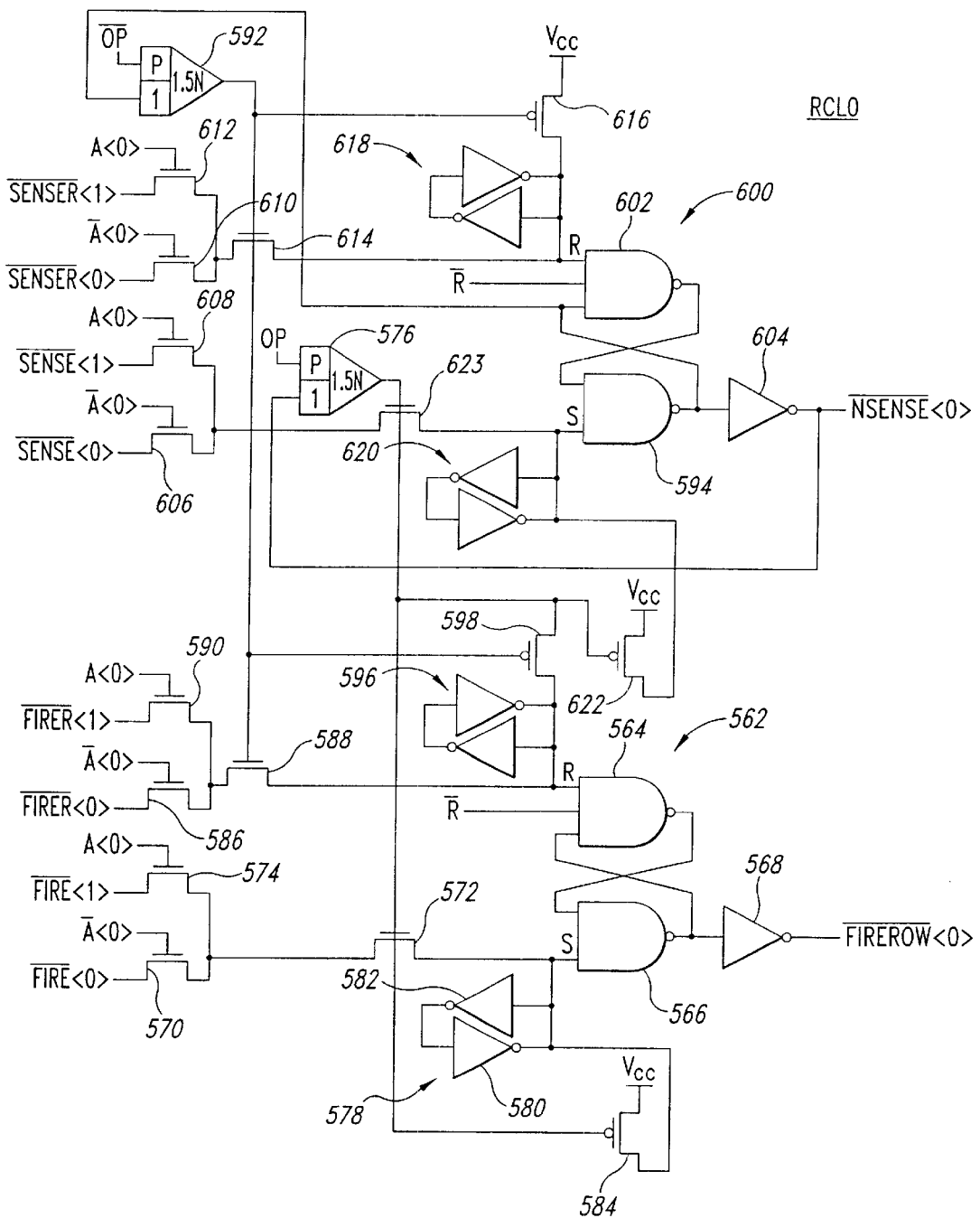
FIGS. 6A and 6B are a schematic of one of the row control latches of FIG. 4 according to one embodiment of the present invention.
Figure 6B:
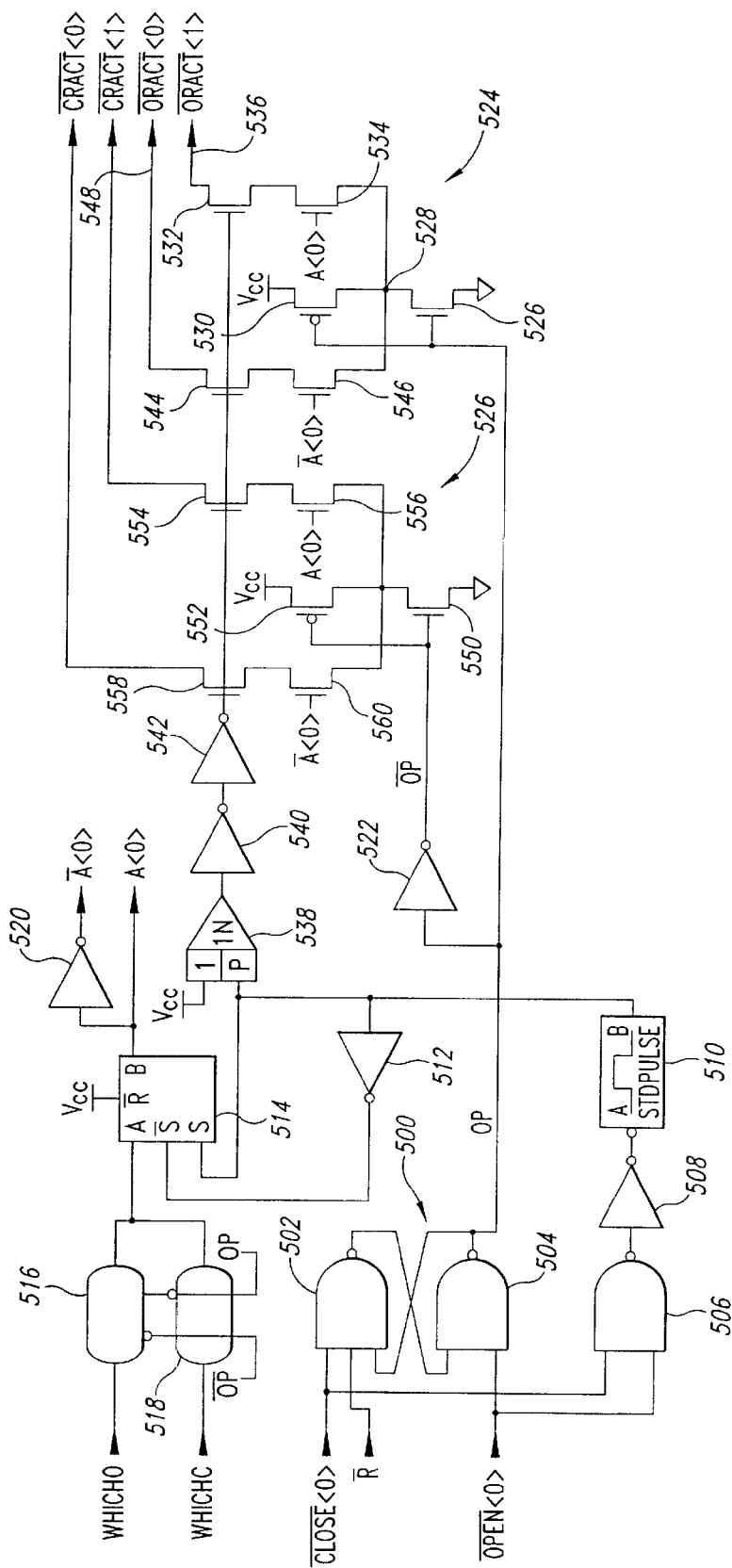

The overall operation of the row command unit 400 and general operation of components within the row command unit have now been described with reference to FIGS. 4 and 5. At this point, several of the components within the command unit 400 will now be described in more detail. FIGS. 6A and 6B are a schematic of one embodiment of the row control latch RCL0 of FIG. 4. All of the row control latches RCL0–RCL31 are identical, and thus, for the sake of brevity, only the row control latch RCL0 will be described in more detail with reference to FIGS. 6A and 6B. Referring to FIG. 6B, the row control latch RCL0 includes a first RS flip-flop 500 formed by cross-coupled NAND gates 502 and 504. The RS flip-flop 500 receives the $\overline{\text{OPEN}}$ <0> and $\overline{\text{CLOSE}}$ <0> signals on respective set and reset inputs, and latches an open signal OP on the output of the NAND gate 504 in response to these signals. A reset signal $\overline{R}$ is applied to the NAND gate 502, and is inactive high during normal operation of the row control latch RCL0 to enable the NAND gate 502.

When. the $\overline{\text{OPEN}}$ <0> signal goes active low, the RS flip-flop 500 is set and latches the OP signal active high, and when the $\overline{\text{CLOSE}}$ <0> signal goes active low the RS flip-flop 500 is reset latching the OP signal inactive low. A NAND gate 506 also receives the $\overline{\text{OPEN}}$ <0> and $\overline{\text{CLOSE}}$ <0> signals on respective inputs, and applies its output through an inverter 508 to trigger a pulse generator 510. In response to a falling-edge transition on its input, the pulse generator 510 generates a high pulse having a predetermined duration on its output, as is well understood by those skilled in the art. The output of the pulse generator 510 is applied directly and through an inverter 512 to clock an edge-triggered register 514. In response to a rising-edge from the pulse generator 510, the register 514 latches either the WHICHO or WHICHC signal that are alternately applied through the parallel-connected transmission or pass gates 516 and 518.

The register 514 outputs the latched signal directly and through an inverter 520 to generate complementary attach signals A<0> and $\overline{A}$ <0>. The pass gates 516 and 518 receive the OP signal and an $\overline{\text{OP}}$ signal from an inverter 522 on their respective control terminals, and operate in a complementary manner in response to these signals. When the OP and $\overline{\text{OP}}$ signals are high and low, respectively, the pass gate 516 turns ON applying the WHICHO signal to the register 514, and when the OP and $\overline{\text{OP}}$ signals are low and high, respectively, the pass gate 518 turns ON applying the WHICHC signal to the register 514.

The row control latch RCL0 further includes first and second activation circuits 524 and 526 that generate the $\overline{\text{ORACT}}$ <0:1> and $\overline{\text{CRACT}}$ <0:1> signals, respectively, as will now be explained in more detail. The activation circuit 524 includes an NMOS transistor 526 that turns ON coupling an enable node 528 to ground when the OP signal applied on its gate is active high. A PMOS transistor 530 couples the enable node 528 to a supply voltage source $V_{CC}$ when the OP signal applied on its gate is inactive low. A first pair of series connected NMOS transistors 532 and 534 are coupled between the enable node 528 and a terminal 536 on which the $\overline{\text{ORACT}}$ <1> signal is developed. The A<0> signal from the register 514 is applied to the gate of the transistor 534, and the output from the pulse generator 510 is applied through a positive-edge delay circuit 538 and series connected inverters 540 and 542 to the gate of the transistor 532.

When the A<0> signal and the output from the inverter 542 are both high, the transistors 532 and 534 turn ON coupling the terminal 536 to the enable node 528 and thereby activating the $\overline{\text{ORACT}}$ <1> signal. The output from the inverter 542 goes high in response to a high pulse from the pulse generator 510. More specifically, in response to a positive-edge transition on the output of the pulse generator 510 the positive-edge delay circuit 538 drives its output high a predetermined time later causing the inverter 542 to drive its output high turning ON the transistor 532. In response to the falling-edge transition on the output of the pulse generator 510, the positive-edge delay circuit 538 drives its output low without any such predetermined delay, causing the inverter 542 to drive its output low and turning OFF the transistor 532. Thus, the transistor 532 turns ON for the duration of the pulse generated by the pulse generator 510 less the predetermined delay of the positive-edge delay circuit 538 and thereby activates the $\overline{\text{ORACT}}$ <1> signal for this duration when the A<0> signal applied to the transistor 534 is high.

A series connected pair of NMOS transistors 544 and 546 are coupled between the enable node 528 and a terminal 548 on which the $\overline{\text{ORACT}}$ <0> signal is developed. The output from the inverter 542 is applied to the gate of the transistor 544 and the $\overline{A}$ <0> signal is applied to the gate of the transistor 546, and these transistors operate in response to the signals applied on their respective gates in the same manner as previously described for the transistors 532 and 534 to activate the $\overline{\text{ORACT}}$ <0> signal. The activation circuit 526 includes transistors 550–560 coupled identically to corresponding transistors in the activation circuit 524, except that the transistor 550 receives the $\overline{\text{OP}}$ signal on its gate. When the $\overline{\text{OP}}$ signal is inactive high, the activation circuit 526 operates in the same manner as previously described for the activation circuit 524 to activate the $\overline{\text{CRACT}}$ <0:1> signals, as will be understood by one skilled in the art.

Referring to FIG. 6A, the row control latch RCL0 further includes an RS flip-flop 562 formed by cross-coupled NAND gates 564 and 566, and having the output from the NAND gate 566 applied through an inverter 568 to generate the $\overline{\text{FIREROW}}$ <0> signal. The RS flip-flop 562 receives a set input S in the form of either the $\overline{\text{FIRE}}$ <0> signal applied through a pair of series connected transistors 570 and 572, or the $\overline{\text{FIRE}}$ <1> signal applied through series connected transistors 574 and 572. The transistors 570 and 574 operate in a complementary manner in response to the $\overline{A}$ <0> and A<0> signals applied on their gates, respectively. A positive-edge delay circuit 576 has its output applied to the gate of the transistor 572, and activates the transistor 572 in response to the OP signal and the $\overline{\text{NSENSE}}$ <0> signal received on respective inputs. When either the OP or $\overline{\text{NSENSE}}$ <0> signals goes low, the positive-edge delay circuit 576 drives its output low without a predetermined delay, turning OFF the transistor 572. When both the OP and $\overline{\text{NSENSE}}$ <0> signals are high, the positive-edge delay circuit 576 drives its output high a predetermined time after both of the signals have gone high, turning ON the transistor 572. A latch 578 formed by cross-coupled inverters 580 and 582 is coupled to the set input S of the RS flip-flop 562 in order to latch the set input S either high or low when the transistor 572 is turned OFF. In this way, the latch 578 prevents the set input S from floating when the transistor 572 is turned OFF. A PMOS transistor 584 couples the set input S to the supply voltage source $V_{CC}$ when the output of the positive-edge delay circuit 576 goes low.

The RS flip-flop 562 receives on its reset input R either the $\overline{\text{FIRER}}$ <0> signal applied through series connected transistors 586 and 588 or the $\overline{\text{FIRER}}$ <1> signal applied through series connected transistors 590 and 588. The transistors 586 and 590 operate in a complementary manner in response to the $\overline{A}$ <0> and A<0> signals applied on their respective gates as previously described for transistors 570 and 574. A positive-edge delay circuit 592 applies its output to control the transistor 588 in response to the $\overline{\text{OP}}$ signal and an output from a NAND gate 594 applied on respective inputs. The positive-edge delay circuit 592 operates in the same manner as previously described for the positive-edge delay circuit 576 in response to its respective input signals, turning OFF the transistor 588 when its output is low and turning ON the transistor 588 when its output is high. A latch 596 is coupled to the reset input R of the RS flip-flop 562 and operates in the same way as the latch 578 to latch the reset input R either high or low when the transistor 588 is turned OFF to thereby prevent the reset input R from floating. A PMOS transistor 598 couples the reset input R of the RS flip-flop 562 to the output of the positive-edge delay circuit 576 when the output from the positive-edge delay circuit 592 applied on its gate is low.

The row control latch RCL0 further includes an RS flip-flop 600 formed by the NAND gate 594 cross-coupled with a NAND gate 602. The output of the flip-flop 600 from the NAND gate 594 is applied through an inverter 604 to generate the $\overline{\text{NSENSE}}$ <0> signal. A number of components 606–623 surrounding the RS flip-flop 600 are coupled in the same way as corresponding components previously described when discussing the RS flip-flop 562, and thus, for the sake of brevity, these components will not be described in further detail. It should be noted that the $\overline{\text{NSENSE}}$ <0> signal is fed back to the input of the positive-edge delay circuit 576, causing the delay circuit 576 to turn OFF the transistors 623 and 572 when the $\overline{\text{NSENSE}}$ <0> signal goes low. The output from the NAND gate 594 fed back to one input of the delay circuit 592 causes that delay circuit to operate in an analogous way to turn OFF the transistors 614 and 588 when the NAND gate 594 drives its output low.

The overall operation of the row control latch RCL0 during open-row and close row operations will now be described in more detail with reference to FIGS. 6A and 6B. Initially, assume the RS flip-flop 500 has been reset latching the OP signal inactive low, and that the RS flip-flops 562 and 600 have likewise been reset latching the $\overline{\text{FIREROW}}$ <0> and $\overline{\text{NSENSE}}$ <0> signals inactive high, respectively. In addition, assume that the WHICHO and WHICHC signals are initially high. To commence an open row operation, the bank control logic 94 (FIG. 4) drives the $\overline{\text{OPEN}}$ <0> signal active low setting the RS flip-flop 500 and latching the OP signal active high. In response to the OP signal going high, the positive-edge delay circuit 576 drives its output high after the predetermined delay time, turning ON the transistors 572 and 623. In response to the low $\overline{\text{OP}}$ signal, the positive-edge delay circuit 592 drives its output low turning OFF the transistors 588 and 614, and thereby isolating or deattaching the closed-row timing circuits 406 and 408 (FIG. 4) from the row control latch RCL0. In addition, the low output from the positive-edge delay circuit 592 also turns ON the transistors 598 and 616 driving the respective reset inputs R of the RS flip-flops 562 and 600 inactive high.

The active high OP signal also turns ON the enable transistor 526, and the low $\overline{\text{OP}}$ signal turns OFF the enable transistor 550. The high OP and low $\overline{\text{OP}}$ signals also turn ON the pass gate 516 applying the WHICHO signal to the input of the register 514. The active low $\overline{\text{OPEN}}$ <0> signal also causes the NAND gate 506 to drive its output high, causing the inverter 508 to drive its output low which triggers the pulse generator 510. In response to the rising-edge transition on the output of the pulse generator 510, the register 514 latches the is high WHICHO signal and places this latched signal on its output, driving the A<0> and $\overline{A}$ <0> signals high and low, respectively. In response to the high A<0> signal, the transistors 556, 534, 574, 590, 608, and 612 turn ON. The low A<0> signal turns OFF the transistors 560, 546, 570, 586, 606, and 610. In this way, the latched value of the WHICHO signal determines the values of the A<0> and $\overline{A}$ <0> signals which, in turn, determine which one of the open-row timing circuits 402 and 404 (FIG. 4) is attached to the row control latch RCL0. In the present example, the high A<0> signal causes the row control latch RCL0 to attach to the open-row timing circuit 404 that generates the $\overline{\text{FIRE}}$ <1> and $\overline{\text{SENSE}}$ <1> signals.

After the row control latch RCL0 has attached to the open-row timing circuit 404, the row control latch RCL0 activates the $\overline{\text{ORACT}}$ <1> signal to trigger the open-row timing circuit 404. More specifically, after the predetermined delay time of the positive-edge delay circuit 538, the delay circuit drives its output high resulting in the inverter 542 driving its output high and thereby turning ON the transistor 532. At this point, the transistors 532 and 534 are both turned ON coupling the terminal 536 to the enable node 528 and thereby activating the $\overline{\text{ORACT}}$ <1> signal. It should be noted that the row control latch RCL0 does not activate the $\overline{\text{ORACT}}$ <1> until after the predetermined delay time of the positive-edge delay circuit 538, enabling the WHICHO signal to be latched and the A<0> and $\overline{A}$ <0> signals generated, which must occur before the transistors 532, 544, 554, and 558 are turned ON so that the proper timing circuit 402–408 (FIG. 4) is activated.

As previously described, the open-row timing circuit 404 (FIG. 4) activates the $\overline{\text{FIRE}}$ <1> signal a first time after receiving the active $\overline{\text{ORACT}}$ <1> signal from the row control latch RCL0. When the $\overline{\text{FIRE}}$ <1> signal goes active low, this active low signal is applied through the transistors 572 and 574 to the set input S of the RS flip-flop 562. In response to the active low set input S, the RS flip-flop 562 is set latching the output of the NAND gate 566 high which is applied through the inverter 566 to latch the $\overline{\text{FIREROW}}$ <0> signal active low and thereby open the addressed row in the memory bank BNK1 coupled to the row control latch RCL0. The open-row timing circuit 404 (FIG. 4) thereafter activates the $\overline{\text{SENSE}}$ <1> signal a second time after activating the $\overline{\text{FIRE}}$ <1> signal. The active low $\overline{\text{SENSE}}$<1> signal is applied through the activated transistors 608 and 623 to the set input S of the RS flip-flop 600. In response to the low $\overline{\text{SENSE}}$ <1> signal applied on its said input S, the RS flip-flop 600 is set latching the output of the NAND gate 594 high and causing the inverter 604 to drive the $\overline{\text{NSENSE}}$ <0> signal active low to thereby activate the sense amplifiers coupled to the digit lines of memory bank BNK1. At this point, the $\overline{\text{FIRE}}$ <1> and $\overline{\text{SENSE}}$ <1> signals have been latched by the RS flip-flops 562 and 600, respectively, enabling the open-row timing circuit 404 to deattach from the row control latch RCL0. When the $\overline{\text{NSENSE}}$ <0> signal goes active low, which indicates the RS flip-flop 600 has latched the $\overline{\text{SENSE}}$ <1> signal from the open-row timing circuit 404, this active low $\overline{\text{NSENSE}}$ <0> signal causes the positive-edge delay circuit 576 to drive its output low turning OFF transistors 623 and 572 and thereby deattaching the open-row timing circuit 404 from the row control latch RCL0. In this way, the open-row timing circuit 404 is attached to the row control latch RCL0 and utilized to activate the $\overline{\text{FIREOW}}$ <0> and $\overline{\text{NSENSE}}$ <0> signals at the proper times to open a row in the memory bank BNK1, and is thereafter deattached from the row control latch RCL0 enabling the open-row timing circuit 404 to be utilized by another row control latch RCL1–RCL31 to open a row in the associated memory banks BNK1–BNK31.

During the close-row mode of operation, the row control latch RCL0 operates substantially the same as just described for the open-row mode of operation except that one of the close-row timing circuits 406 and 408 (FIG. 4) is attached to the row control latch RCL0 and the signals generated by the attached close-row timing circuit are latched by the row control latch RCL0 to sequentially deactivate the $\overline{\text{FIREROW}}$ <0> and $\overline{\text{NSENSE}}$ <0> signals. Thus, a detailed description of the operation of the row control latch RCL0 during the closed-row mode of operation is omitted merely for the sake of brevity as such operation will be understood by one skilled in the art.

Briefly, during the close-row mode of operation, the $\overline{\text{CLOSE}}$ <0> signal goes active low, resetting the RS flip-flop 500 which, in turn, latches the OP signal inactive low. In response to the inactive low OP signal, the pass gate 518 turns ON and the WHICHC signal is thereafter latched by the register 514, generating the A<0> and $\overline{\text{A}}$ <0> signals that attach one of the close-row timing circuits 406 and 408 (FIG. 4) to the row control latch RCL0. In addition, note that the inactive low OP signal causes the positive-edge delay circuit 576 to drive its output low turning OFF the transistors 623 and 572 and isolating or deattaching the open-row timing circuits 402 and 404 (FIG. 4) from the row control latch RCL0. Finally, in response to the inactive low OP signal, the inverter 522 drives the $\overline{\text{OP}}$ signal high turning ON the enable transistor 550 such that the activation circuit 526 will thereafter activate one of the $\overline{\text{CRACT}}$ <0:1> signals in the same way as the operation previously described for the activation circuit 524. When the flip-flop 600 is reset in response to the $\overline{\text{SENSER}}$ signal from the attached close-row timing circuit 406,408, the output of NAND gate 594 goes low turning OFF transistors 614 and 588 to deattach the latch RCL0 from the close-row timing circuit 406 or 408.

Figure 7:
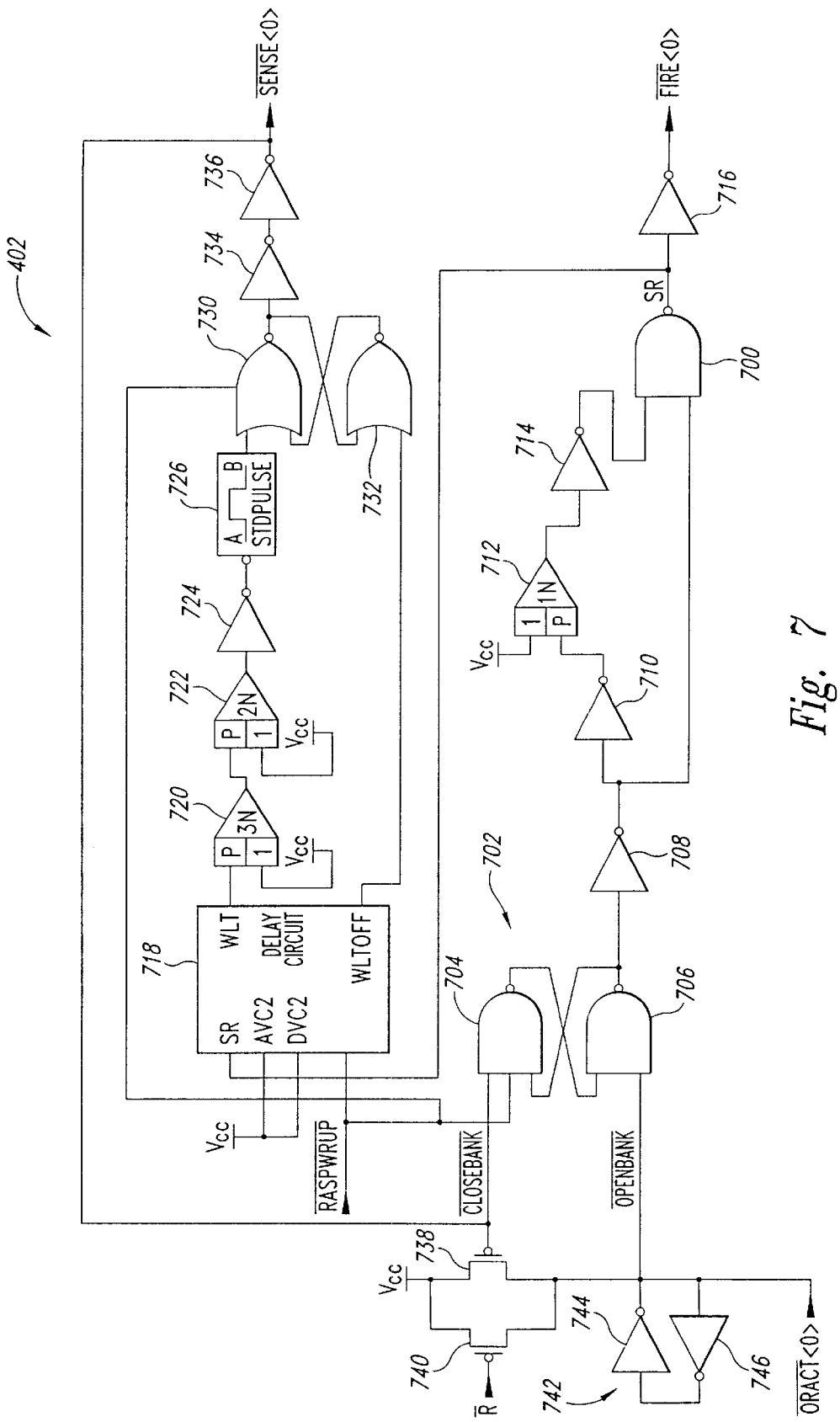
FIG. 7 is a schematic of one of the open-row timing circuits of FIG. 4 according to one embodiment of the present invention.

FIG. 7 is a schematic of one embodiment of the open-row timing circuit 402 of FIG. 4. The open-row timing circuits 402 and 404 are identical and thus, for the sake of brevity, only the open-row timing circuit 402 will be described in more detail with reference to FIG. 7. A NAND gate 700 develops a set-reset signal SR on its output in response to an output from an RS flip-flop 702 formed by cross-coupled NAND gates 704 and 706. More specifically, the output from the NAND gate 706 is applied through an inverter 708 to a first input of the NAND gate 700, and the output from the inverter 708 is applied through a series-connected inverter 710, positive-edge delay circuit 712, and inverter 714 to a second input of the NAND gate 700. The RS flip-flop 702 receives an $\overline{\text{OPENBANK}}$ signal on its set input and a $\overline{\text{CLOSEBANK}}$ signal on its reset input. When the $\overline{\text{OPENBANK}}$ signal goes active low, the RS flip-flop 702 latches the output from the NAND gate 706 high causing the inverter 708 to drive its output low. In response to the low output from the inverter 708, the NAND gate 700 drives the SR signal high. When the $\overline{\text{CLOSEBANK}}$ signal goes active low, the RS flip-flop 702 latches the output from the NAND gate 706 low causing the inverter 708 to drive its output high. In response to the high output from the inverter 708, the NAND gate 700 receives two high inputs and drives the SR signal low.

The SR signal from the NAND gate 700 is applied through an inverter 716 to generate the $\overline{\text{FIRE}}$ <0> signal, and is further applied to a set-reset input of a delay circuit 718. In response to the high SR signal, the delay circuit 718 generates a pair of word line signals WLT,WLTOFF a delay time after the rising edge of the SR signal. The delay time of the delay circuit 718 emulates the timing of an actual word line in the memory banks BNK0–BNK31 and corresponds to the time it takes for the voltage on the word line of an addressed row to reach a desired threshold value. As previously described, the word lines in the memory banks BNK0–BNK31 typically present large capacitive loads, and thus the voltage on the word line increases exponentially as the word line is charged in response to the $\overline{\text{FIRE}}$ <0> signal.

The WLT signal is applied through series-connected positive-edge delay circuits 720 and 722 and inverter 724 to a pulse generator 726. The output from the pulse generator 726 is applied to an input of a NOR gate 730 that is cross-coupled with a NOR gate 732. The WLTOFF signal from the delay circuit 718 is applied directly to an input of the NOR gate 732. The cross-coupled NOR gates 730, 732 merely operate to generate a low pulse on the output of the NOR gate 730 having the same duration as the pulse from the pulse generator 726, as will be described in more detail below. In the circuit 402, the NOR gate 732 could be eliminated and the NOR gate 730 replaced with an inverter coupled between the pulse generator 726 and inverter 734. The output of the NAND gate 730 is applied through series connected inverters 734 and 736 to generate the $\overline{\text{SENSE}}$ <0> signal. The $\overline{\text{SENSE}}$ <0> signal is applied to the reset input of the RS flip-flop 702 to reset the flip-flop 702 when the $\overline{\text{SENSE}}$ <0> signal goes active low.

A PMOS transistor 738 also receives the $\overline{\text{SENSE}}$ <0> signal, and couples the set input of the RS flip-flop 702 to the supply voltage $V_{CC}$ when the $\overline{\text{SENSE}}$ <0> signal goes active low. In this way, the transistor 738 drives the $\overline{\text{OPENBANK}}$ signal applied to the set input of the RS flip-flop 702 inactive high in response to the $\overline{\text{SENSE}}$ <0> signal going active low, enabling the $\overline{\text{CLOSEBANK}}$ signal to reset the RS flip-flop 702. A reset transistor 740 also drives the $\overline{\text{OPENBANK}}$ signal inactive high when a reset signal $\overline{\text{R}}$ applied on its gate goes active low during a reset mode of operation, which is to be distinguished from the reset of the open-row timing circuit during normal operation. For the following description, the $\overline{R}$ signal is assumed to be inactive high. A latch 742 formed by cross-coupled inverters 744 and 746 latches the $\overline{\text{OPENBANK}}$ signal inactive high when the transistor 738 is activated, and active low when the $\overline{\text{ORACT}}$ <0> signal from a selected one of the row control latches RCL0–RCL31 goes active low.

The overall operation of the open-row timing circuit 402 in generating the $\overline{\text{FIRE}}$ <0> and $\overline{\text{SENSE}}$ <0> signals will now be described in more detail. Initially, assume the open-row timing circuit has just been reset so that the $\overline{\text{FIRE}}$ <0>, $\overline{\text{SENSE}}$ <0>, and $\overline{\text{OPENBANK}}$ signals are all inactive high. To trigger the open-row timing circuit 402, the row control latch RCL0–RCL31 to which the open-row timing circuit 402 is attached drives the $\overline{\text{ORACT}}$ <0> signal low setting the latch 702 and thereby latching the output from the NAND gate 706 high. In response to the high output from the NAND gate 706, the inverter 708 drives its output low causing the NAND gate 700 to drive the SR signal high. The high SR signal is applied through the inverter 716 to activate the $\overline{\text{FIRE}}$ <0> signal, which is latched by the row control latch RCL0–RCL31 to which the open-row timing circuit 402 is attached, as previously described.

The high SR signal from the NAND gate 700 is also applied to the delay circuit 718 which drives the WLT, WLTOFF signals high the delay time after receiving the active high SR signal. After the active high SR signal is applied to the delay circuit 718 but before the delay circuit 718 drives the WLT, WLTOFF signals high, the output from the NOR gate 730 remains high, and this high output is applied through the series connected inverters 734, 736 to maintain the $\overline{\text{SENSE}}$ <0> signal inactive high. The delay circuit 718 thereafter drives the WLT and WLTOFF signals high after the delay time and the high WLTOFF signal is applied directly to the NOR gate 732. The high WLTOFF signal applied to the input of the NOR gate 732 does not affect operation of the circuit 402 in this embodiment. The high WLT signal from the delay circuit 718 is delayed by the delay circuits 720 and 722, and thus does not immediately trigger the pulse generator 726. After the delay time of the delay circuits 720 and 722, the inverter 724 drives its output low triggering the pulse generator 726 which applies an active high pulse to the NOR gate 730 which, in turn, drives its output low. When the output from the NOR gate 730 goes low, this low output is applied through the series connected inverters 734 and 736 to pulse the $\overline{\text{SENSE}}$ <0> signal active low. The active low $\overline{\text{SENSE}}$ <0> signal is latched by the row control latch RCL0–RCL31 to which the open-row timing circuit 402 is attached, as previously described. It should be noted that the $\overline{\text{SENSE}}$ <0> signal goes active low only for the duration of the pulse generated by the pulse generator 726 because the NOR gate 730 drives its output high upon termination of the pulse from the pulse generator 726.

In response to the $\overline{\text{SENSE}}$ <0> signal going active low, the transistor 738 turns ON driving the $\overline{\text{OPENBANK}}$ inactive high. It should be noted that the transistor 738 is able to drive the $\overline{\text{OPENBANK}}$ signal inactive high because the row control latch RCL0–RCL31 to which the open-row timing circuit 402 was attached has by this time deattached from the open row timing circuit and thus is no longer driving the $\overline{\text{ORACT}}$ <0> signal low. Thus, when the $\overline{\text{SENSE}}$ <0> signal goes active low, the RS flip-flop 702 receives an active low $\overline{\text{CLOSEBANK}}$ signal and an inactive high $\overline{\text{OPENBANK}}$ signal, resetting the RS flip-flop 702 which latches the output from the NAND gate 706 low. In response to the low output from the NAND gate 706, the inverter 708 drives its output high causing the NAND gate 700 to drive the SR signal low. When the SR signal goes low, the inverter 716 drives the $\overline{\text{FIRE}}$ <0> signal inactive high resetting this signal. The low SR signal also causes the delay circuit 718 to drive the WLT,WLTOFF signals low without the delay time. The low WLT, WLTOFF signals do not change the state of the NOR gate 730 which, as previously described, drives its output high upon termination of the pulse from the pulse generator 726. Thus, the low SR signal merely resets the delay circuit 718 in anticipation of receiving the next active high SR signal once the open-row timing circuit 402 has been attached to another row control latch RCL0–RCL31.

Figure 8:
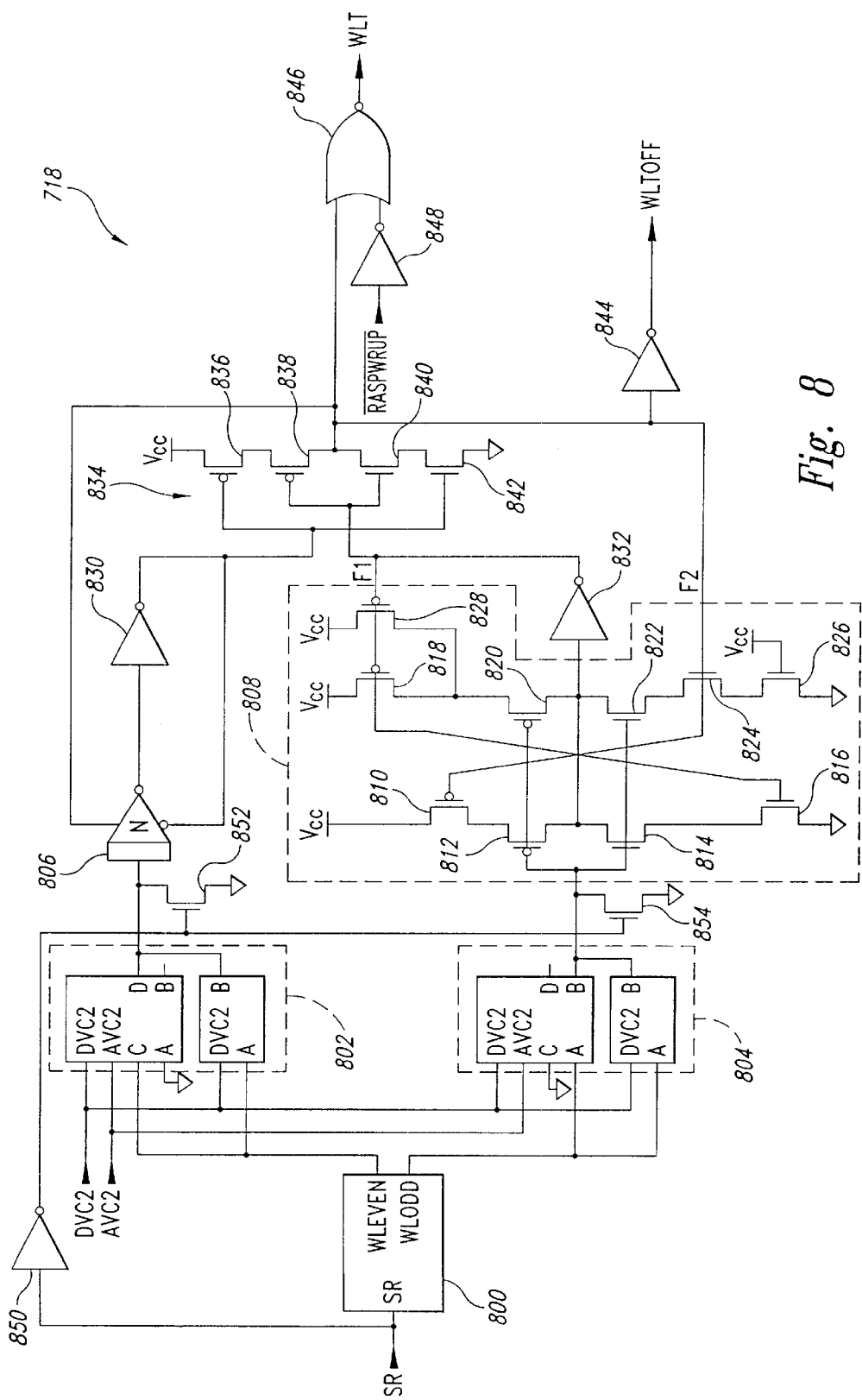
FIG. 8 is a schematic of the open-delay circuit of FIG. 7 according to one embodiment of the present invention.

FIG. 8 is a schematic of one embodiment of the delay circuit 718 of FIG. 7. A level translator 800 receives the SR signal and generates WLEVEN and WLODD signals in response to the SR signal. When the SR signal goes low, the level translator 800 drives the WLEVEN,WLODD signals low to approximately zero volts, and when the SR signal goes high the level translator 800 drives the WLEVEN, WLODD signals to a pumped supply voltage $V_{CCP}$. As understood by one skilled in the art, the pumped supply voltage $V_{CCP}$ is the voltage applied to actual word lines to open a row in the memory banks BNK0–BNK31. The WLEVEN and WLODD signals are output from the level translator 800 to respective mini-arrays or word line modeling circuits 802 and 804. Each of the word line modeling circuits 802 and 804 includes a word line that models the actual physical characteristics of the even and odd word lines, respectively, in each of the memory banks BNK0–BNK31. Typically, each of the modeling circuits 802, 804 includes a word line crossing the same number of digit lines and having the same physical layout as do actual respective even and odd word lines in the memory banks BNK0–BNK31. Both even and odd word lines are modeled because each can have different physical characteristics due to the actual physical layout of these word lines within the memory banks, as will be understood by one skilled in the art. It should be noted that the word line modeling circuits 802 and 804 typically occupy a relatively large area on the substrate in which the open-row timing circuit 402 (FIG. 7) is formed due primarily to the physical size of the model word lines in these circuits. By reducing the number of open-row timing circuits 402,404, the number of word line modeling circuits 802,804 are reduced accordingly so the row command unit 400 (FIG. 4) may occupy substantially less area on the substrate than conventional row command units where one row timing circuit is required for each memory bank.

The outputs from the word line modeling circuits 802 and 804 are applied to respective Schmitt triggers 806 and 808. The Schmitt trigger 808 is shown in more detail and includes transistors 810–828 coupled as shown. As understood by one skilled in the art, the Schmitt trigger 808 includes two parallel inverters formed by transistors 812, 814, and 820, 822, respectively, each inverter having a different trigger levels. As understood by one skilled in the art, the trigger level of an inverter may be adjusted by adjusting the relative channel widths of the transistors forming the inverter. The two inverters in the Schmitt trigger 808 are selectively enabled by two feedback signals F1 and F2 such that when a rising-edge transition on the input of the Schmitt trigger 808 is received the inverter with the higher trigger level is enabled, and when a falling-edge transition on the input of the Schmitt trigger 808 is received the inverter with the lower trigger level is enabled. The outputs from the Schmitt triggers 806 and 808 are applied through respective inverters 830 and 832 to respective inputs of a NAND gate 834 including PMOS transistors 836 and 838 and NMOS transistors 840 and 842 coupled in series as shown. The output of the NAND gate 834 is applied through an inverter 844 to generate the WLTOFF signal, and through a NOR gate 846 to generate the WLT signal. An $\overline{\text{RASPWRUP}}$ signal is applied through an inverter 848 to enable the NOR gate 846 during normal operation. An inverter 850 applies the SR signal to the gates of the reset transistors 852,854, driving the outputs from the respective modeling circuits 802, 804 low when these respective transistors are enabled.

In operation, the delay circuit 718 drives the WLT, WLTOFF signals high a delay time after the SR signal goes high, as will now be explained in more detail. When the SR signal goes high, the level translator 800 applies the WLEVEN,WLODD signals at the pumped supply voltage $V_{CCP}$ to the word line modeling circuits 802 and 804, respectively. The voltages on the outputs of the circuits 802 and 804 thereafter begin charging towards the pumped supply voltage $V_{CCP}$ according to the physical resistive and capacitive characteristics (i.e., the RC time constant) of the word lines contained within the modeling circuits 802 and 804. When the outputs of the word line modeling circuits 802 and 804 reach the trigger levels of the Schmitt triggers 806 and 808, respectively, the Schmitt triggers drive their respective outputs low causing the inverters 830 and 832 to drive their outputs high. The NAND gate 834 ensures that the slower of the even and odd word lines contained in the word line modeling circuits 802 and 804, respectively, has exceeded the trigger level of the corresponding Schmitt trigger 806 and 808. For example, if the even word line in the modeling circuit 802 charges more quickly than the odd word line in the modeling circuit 804, the Schmitt trigger 806 will be triggered first causing the inverter 830 to drive its output high while the output from the inverter 832 remains low. Only after the voltage on the odd word line in the modeling circuit 804 exceeds the threshold voltage of the Schmitt trigger 808 does the inverter 832 drive its output high. Thus, the NAND gate 834 ensures the voltage on the slower of the even and odd word lines contained in the modeling circuits 802 and 804, respectively, has exceeded the desired threshold voltage before driving its output low to thereby activate the WLT,WLTOFF signals.

Figure 9:
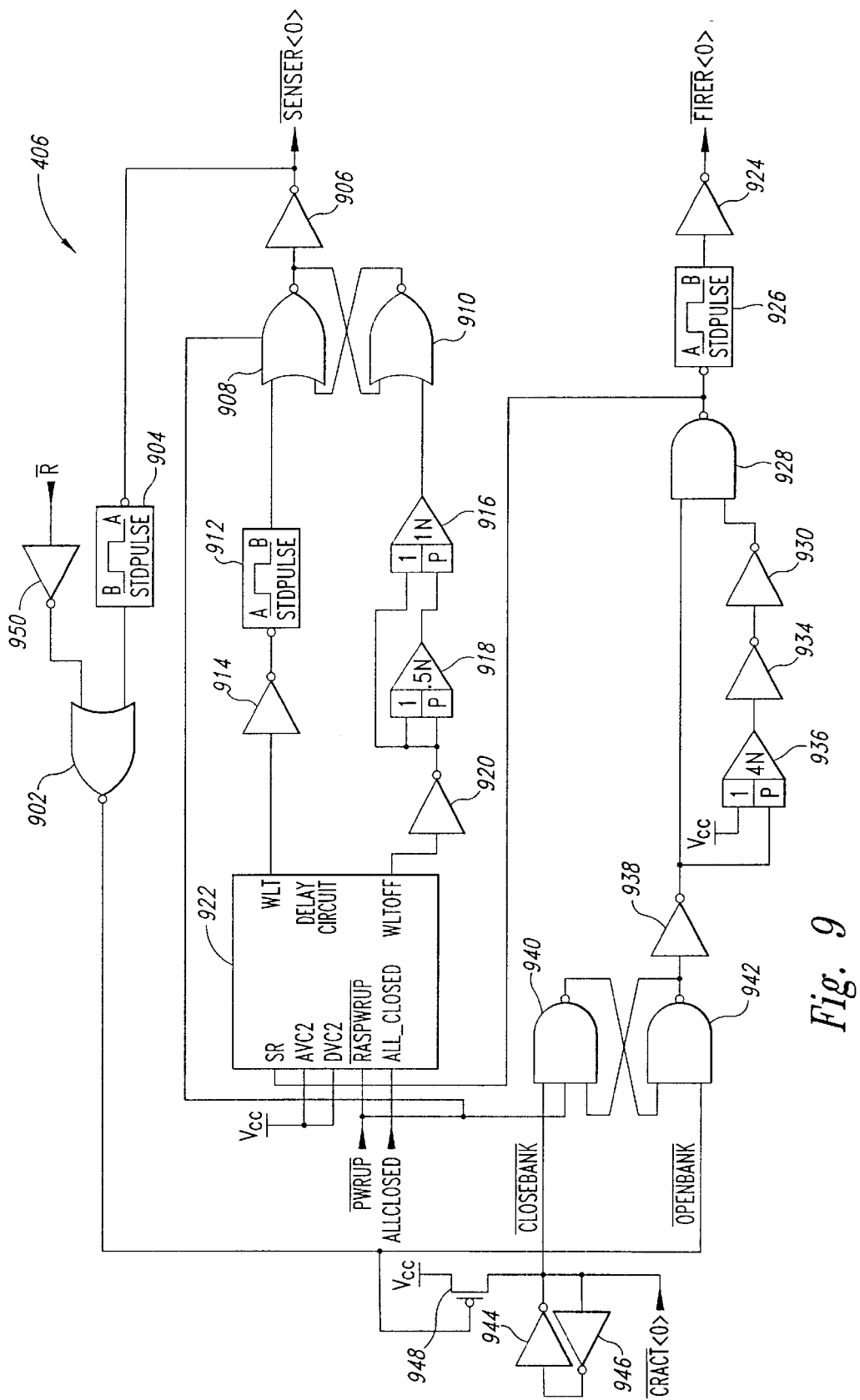
FIG. 9 is a schematic of one of the close-row timing circuits of FIG. 4 according to one embodiment of the present invention.
Figure 10:
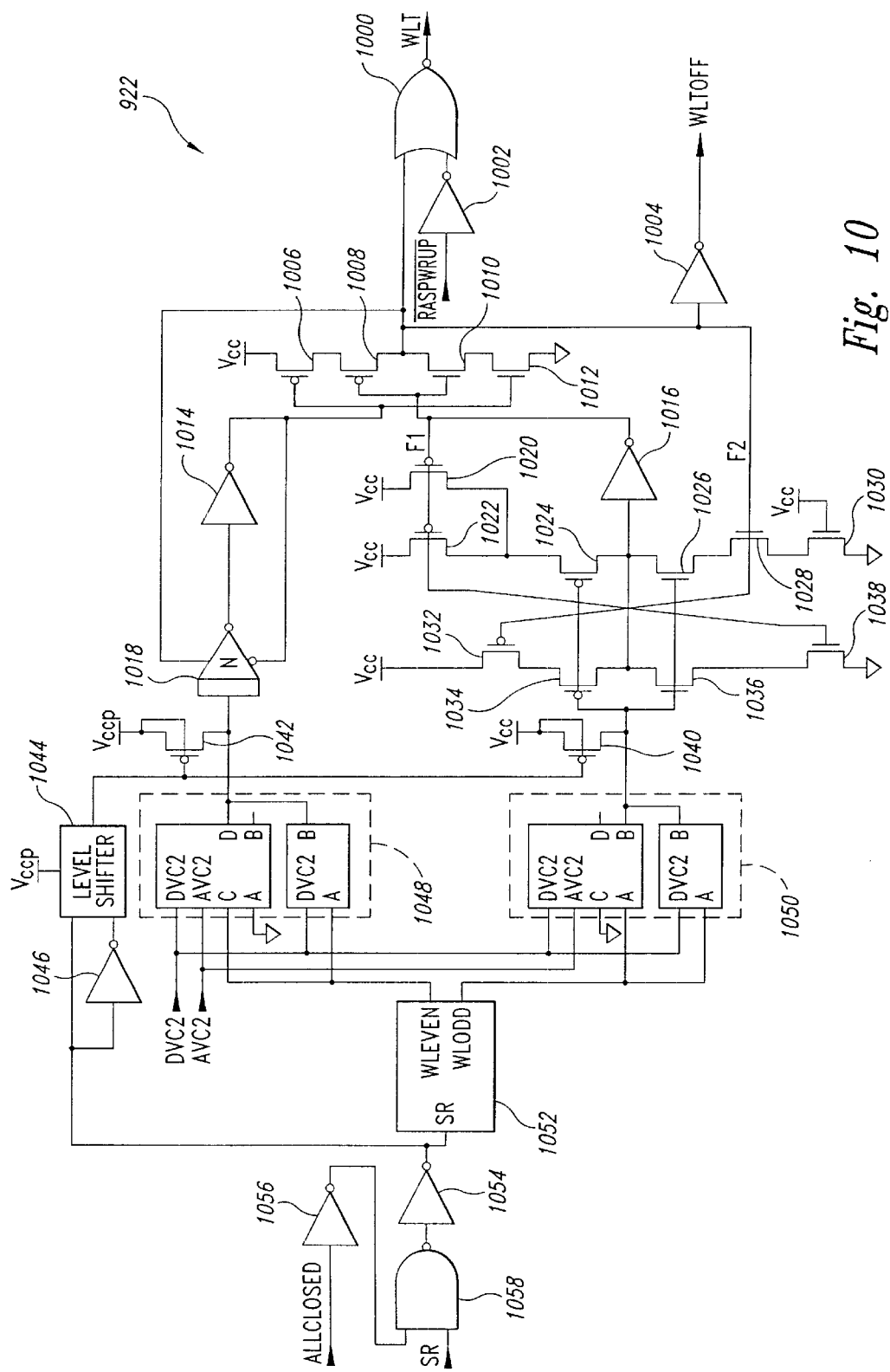
FIG. 10 is a schematic of the close-delay circuit of FIG. 9 according to one embodiment of the present invention.

FIG. 9 is a detailed schematic of the close-row timing circuit 406 of FIG. 4. The close-row timing circuits 406 and 408 of FIG. 4 are identical, and thus, for the sake of brevity, only the timing circuit 406 will be described in more detail with reference to FIG. 8. The close-row timing circuit includes components 900–948 coupled as shown. In operation, the close-row timing circuit 406 is activated by the $\overline{\text{CRACT}}$ <0> signal from the row control latch RCL0–RCL31 to which it is attached. In response to the active $\overline{\text{CRACT}}$ <0> signal, the close-row timing circuit 406 drives the $\overline{\text{FIRER}}$ <0> signal active low and a delay time later drives the $\overline{\text{SENSER}}$ <0> signal active low in substantially the same manner as previously described for the open-row timing circuit 402 of FIG. 7. Thus, although the interconnection and operation of the components 900–948 within the closed-row timing circuit are not identical with those previously described for the open-row timing circuit 402 of FIG. 7, one skilled in the art will clearly understand the operation of the closed-row timing circuit 406 and, for the sake of brevity, the closed-row timing circuit 406 will not be described in further detail. Similarly, FIG. 10 depicts the delay circuit 922 of the close-row timing circuit 406 of FIG. 9 including components 1000–1058 interconnected as shown. Once again, the interconnection of the components 1000–1058 and operation of these components is substantially the same as previously described for the delay circuit 718 of FIG. 8, and one skilled in the art will clearly understand the function of the individual components 1000–1058 and operation of these components in the delay circuit 922. Thus, for the sake of brevity, the delay circuit 922 will not be discussed in further detail.

Figure 11:
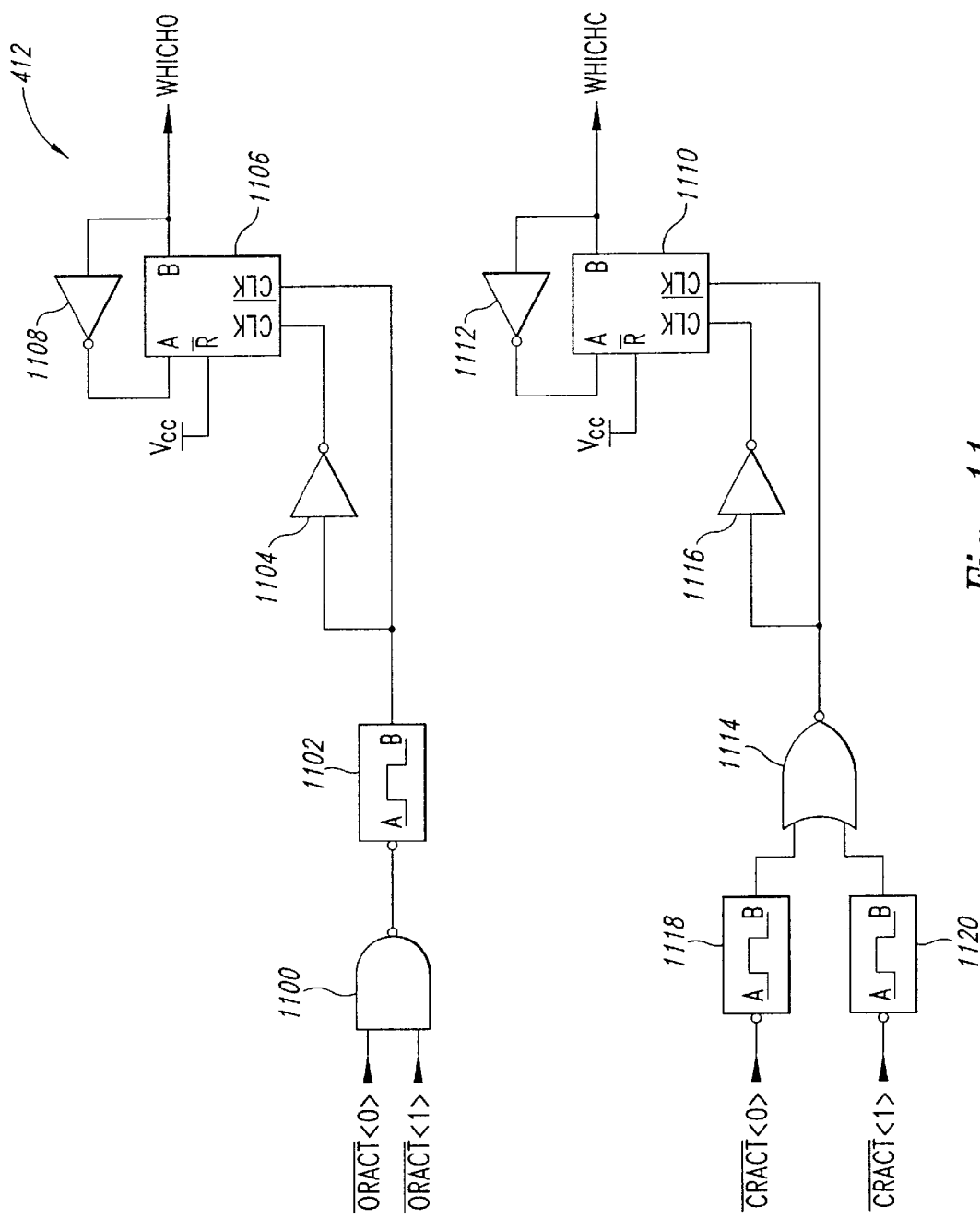
FIG. 11 is a schematic of the selection circuit of FIG. 4 according to one embodiment of the present invention.

FIG. 11 is a schematic of one embodiment of the selection circuit 412 of FIG. 4. A NAND gate 1100 receives the $\overline{\text{ORACT}}$ <0> and $\overline{\text{ORACT}}$ <1> signals on respective inputs and applies its output to a pulse generator 1102. The output of the pulse generator 1102 is applied directly and through an inverter 1104 to clock a register 1106 having its output fed back to its input through an inverter 1108. The register 1106 is a conventional register including series connected latches and pass gates as understood by one skilled in the art, and operates to shift data applied on its input into a first stage latch when the CLK and CLK signals are high and low, respectively. The register 1106 thereafter shifts the data stored in the first stage latch into a second stage latch and outputs that data as the WHICHO signal when the CLK and CLK signals are low and high, respectively. In operation, the $\overline{\text{ORACT}}$ <0:1> signals are high when none of the row control latches RCL0–RCL31 is attached to one of the open-row timing circuits 402 and 404 (FIG. 4). At this point, the pulse generator 1102 maintains its output low causing the output from the inverter 1108 to be shifted into the first stage of the register 1106 as previously described.

When either of the $\overline{\text{ORACT}}$ <0:1> signals goes low, the NAND gate 1100 drives its output high, but the pulse generator 1102 does not generate a pulse on its output since it only generates such a pulse in response to a falling-edge transition on its input. The one of the $\overline{\text{ORACT}}$ <0:1> signals which went low will thereafter go high when the corresponding one of the open-row timing circuits 402 and 404 (FIG. 4) is reset as previously described with reference to FIG. 6. When this occurs, both $\overline{\text{ORACT}}$ <0:1> signals are again high and the NAND gate 1100 drives its output low triggering the pulse generator 1102 which, in turn, clocks the register 1106. When the register 1106 is clocked, the value stored in the first stage of the register is shifted to its output as the new WHICHO signal. The inverter 1108 applies the complement of the current WHICHO signal to the input of the register 1106 and this complement is thus shifted out of the register 1106 as the new WHICHO signal when the register is clocked. In this way, the value of the WHICHO signal alternately goes high and low each time the pulse generator 1102 clocks the register 1106.

The selection circuit 412 further includes a register 1110 and an inverter 1112 coupled in the same manner as the register 1106 and inverter 1108. The register 1110 and inverter 1112 operate identically to the register 1106 and inverter 1108 when clocked by the output of a NOR gate 1114 that is applied to the register 1110 directly and through an inverter 1116. A pair of pulse generators 1118 and 1120 receive the $\overline{\text{CRACT}}$ <0> and $\overline{\text{CRACT}}$ <1> signals on respective inputs and apply their respective pulse outputs to the NOR gate 1114. In operation, the $\overline{\text{CRACT}}$ <0:1> signals are both high when neither of the close-row timing circuits 406 and 408 is activated, causing both pulse generators 1118 and 1120 to maintain their respective outputs low and causing the NOR gate 1114 to drive its output high. At this point, the register 1110 outputs the value stored in its second stage as the WHICHC signal. When either of the $\overline{\text{CRACT}}$ <0:1> signals goes low, the corresponding one of the pulse generators 1118 and 1120 applies a high pulse to the NOR gate 1114. In response to the high pulse from one of the pulse generators 1118 and 1120, the NOR gate 1114 pulses its output low clocking the register 1110 and toggling the WHICHC signal. In this way, the value of the WHICHC signal alternately goes high and low each time the register 1110 is clocked responsive to either of the $\overline{\text{CRACT}}$ <0:1> signals going low.

The operation of the open-row timing circuits 402, 404 and close-row timing circuits 406, 408, which are commonly referred to as RAS timing chains, will be understood by those skilled in the art. A more detailed description of RAS timing chains is provided in U.S. Patent Application No. 09/104,423 to Manning entitled METHOD AND SYSTEM FOR PROCESSING COMMANDS IN A PACKETIZED DYNAMIC RANDOM ACCESS MEMORY, which is incorporated herein by reference.

It is to be understood that even though various embodiments and advantages of the present invention have been set forth in the foregoing description, the above disclosure is illustrative only, and changes may be made in detail and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A row command unit in an integrated circuit including a plurality of memory banks, comprising:

a plurality of row control latches, each row control latch having an output coupled to a respective memory bank and having an enable terminal and a control terminal, the row control latch latching a signal applied on the control terminal when an active enable signal is applied on the enable terminal;

a delay circuit having an output terminal coupled to the control terminals of the row control latches and having an input terminal, the delay circuit generating a row control signal on its output responsive to an activation signal applied on its input; and a bank control circuit coupled to the input terminal of the delay circuit and having input terminals adapted to receive respective bank address and bank control signals, the bank control circuit also having a plurality of output terminals, each output terminal coupled to a respective enable terminal of one of the row control latches, the bank control circuit operable to apply an active enable signal to one of the row control latches and to apply an active activation signal to the delay circuit responsive to the bank control and bank address signals.

2. The row command unit of claim 1 wherein the delay circuit generates the row control signal a predetermined time after the activation signal goes active.

3. The row command unit of claim 1 wherein the bank control circuit comprises:

an address decoder having a plurality of outputs, the address decoder generating on a respective one of the outputs a decoded bank address signal corresponding to the value of the bank address signal;

a control pulse generator generating an activation pulse responsive to the bank control signal going active and generating a deactivation pulse responsive to the bank control signal going inactive; and a plurality of logic circuits, each logic circuit coupled to the control pulse generator and to a respective one of the row control latches, and further coupled to a respective one of the outputs of the address decoder to receive the corresponding decoded bank address signal, each logic circuit operable when the decoded bank address signal and activation pulse are active to apply an active open row signal to the row control latch to cause the latch to open a row in the corresponding memory bank, and operable when the decoded bank address signal and deactivation pulse are active to apply an active close row signal to the row control latch to cause the latch to close a row in the corresponding memory bank.

4. The row command unit of claim 3 wherein each of the logic circuits comprises a pair of NAND gates, each pair including a first NAND gate coupled to receive the output from the address decoder and the activation pulse on respective inputs, and the pair further including a second NAND gate coupled to receive the output from the address decoder and the deactivation pulse on respective inputs.

5. The row command unit of claim 1 wherein each row control latch comprises:

an enable storage circuit having an input terminal coupled to receive the enable signal, and having an output terminal, the enable storage circuit latching the enable signal applied on its input terminal and applying the latched enable signal on its output terminal;

a switch circuit having a first signal terminal coupled to the output of the delay circuit to receive the row control signal, a second signal terminal, and a control terminal coupled to the output terminal of the enable storage circuit to receive the latched enable signal, the switch circuit coupling the first signal terminal to the second signal terminal when the latched enable signal goes active; and a row storage circuit having an input terminal coupled to the second signal terminal of the switch circuit and an output terminal coupled to the corresponding memory bank, the enable storage circuit latching the row control signal applied on its input terminal when the switch circuit is activated and applying the latched signal on its output terminal.

6. The row command unit of claim 5 wherein each of the storage circuits comprises an RS flip-flop.

7. A row command unit in an integrated circuit including a plurality of memory banks, comprising:

a plurality of row control latches, each row control latch having an output coupled to a respective memory bank and having an enable terminal and a control terminal, the row control latch latching a signal applied on the control terminal when an active enable signal is applied on the enable terminal and applying the latched signal on the output to apply the latched signal to the corresponding memory bank;

a delay circuit having an output terminal coupled to the control terminals of the row control latches and having an input terminal, the delay circuit generating a row control signal on the output responsive to an activation signal applied on its input; and a bank control circuit coupled to the input terminal of the delay circuit and having input terminals adapted to receive respective bank address and bank control signals, the bank control circuit also having a plurality of output terminals, each output terminal being coupled to a respective enable terminal of one of the row control latches, the bank control circuit applying an active activation signal to the delay circuit responsive to the bank control and bank address signals to cause the delay circuit to generate the row control signal, and selecting one of the row control latches and applying an active enable signal to the selected row control latch to cause the row control latch to latch the row control signal from the delay circuit and provide the latched row control signal on the output of the row control latch.

8. The row command unit of claim 7 wherein the delay circuit generates the row control signal a predetermined time after the activation signal goes active.

9. The row command unit of claim 7 wherein the bank control circuit comprises:

an address decoder having a plurality of outputs, the address decoder generating on a respective one of the outputs a decoded bank address signal corresponding to the value of the bank address signal;

a control pulse generator generating an activation pulse responsive to the bank control signal going active and generating a deactivation pulse responsive to the bank control signal going inactive; and a plurality of logic circuits, each logic circuit coupled to the control pulse generator and to a respective one of the row control latches, and further coupled to a respective one of the outputs of the address decoder to receive the corresponding decoded bank address signal, each logic circuit operable when the decoded bank address signal and activation pulse are active to apply an active open row signal to the row control latch to cause the latch to open a row in the corresponding memory bank, and operable when the decoded bank address signal and deactivation pulse are active to apply an active close row signal to the row control latch to cause the latch to close a row in the corresponding memory bank.

10. The row command unit of claim 9 wherein each of the logic circuits comprises a pair of NAND gates, each pair including a first NAND gate coupled to receive the output from the address decoder and the activation pulse on respective inputs, and the pair further including a second NAND gate coupled to receive the output from the address decoder and the deactivation pulse on respective inputs.

11. The row command unit of claim 7 wherein each row control latch comprises:

an enable storage circuit having an input terminal coupled to receive the enable signal, and having an output terminal, the enable storage circuit latching the enable signal applied on its input terminal and applying the latched enable signal on its output terminal;

a switch circuit having a first signal terminal coupled to the output of the delay circuit to receive the row control signal, a second signal terminal, and a control terminal coupled to the output terminal of the enable storage circuit to receive the latched enable signal, the switch circuit coupling the first signal terminal to the second signal terminal when the latched enable signal goes active; and a row storage circuit having an input terminal coupled to the second signal terminal of the switch circuit and an output terminal coupled to the corresponding memory bank, the enable storage circuit latching the row control signal applied on its input terminal when the switch circuit is activated and applying the latched signal on its output terminal.

12. The row command unit of claim 11 wherein each of the storage circuits comprises an RS flip-flop.

13. A row command unit in an integrated circuit including a plurality of memory banks, comprising:

a plurality of row control means being coupled to a respective memory bank and having an enable terminal and a control terminal, for latching a signal applied on an input and supplying the latched signal on an output in response to an active enable signal;

a delay means for generating a row control signal responsive to an activation signal; and a bank control means for receiving respective bank address and bank control signals and for applying an active activation signal to the delay circuit responsive to the bank control and bank address signals to cause the delay circuit to generate the row control signal, and for selecting one of the plurality of row control means and applying an active enable signal to the selected row control means to cause the row control means to latch the row control signal from the delay means and provide the latched row control signal on the output of the selected row control means.

14. The row command unit of claim 13 wherein the delay means generates the row control signal a predetermined time after the activation signal goes active.

15. The row command unit of claim 13 wherein the bank control means comprises:

an address decoding means for generating on a respective output a decoded bank address signal corresponding to the value of the bank address signal;

a control pulse generation means for generating an activation pulse responsive to the bank control signal going active and generating a deactivation pulse responsive to the bank control signal going inactive; and a plurality of logic means coupled to the control pulse generation means and to a respective one of the row control means, and further coupled to a respective output of the address decoding means to receive the corresponding decoded bank address signal for, each logic means for applying an active open row signal to the row control means to cause the means to open a row in the corresponding memory bank when the decoded bank address signal and activation pulse are active, and for applying an active close row signal to the row control latch to cause the latch to close a row in the corresponding memory bank. when the decoded bank address signal and deactivation pulse are active.

16. The row command unit of claim 13 wherein each row control means comprises:

an enable storage means coupled to receive the enable signal for latching the enable signal and applying the latched enable signal on an output;

a switching means coupled to receive the row control signal and coupled to receive the latched enable signal for providing the row control signal on an output responsive; to the latched enable signal being active; and a row storage means coupled to the output of the switching means to receive the row control signal for latching the applied row control signal responsive to the latched enable signal from the switching means being active and for applying the latched signal to a respective memory bank.

* * * * *

UNITED STATES PATENT AND TRADEMARK OFFICE
CERTIFICATE OF CORRECTION

PATENT NO.    : 6,496,440 B2
DATED         : December 17, 2002
INVENTOR(S)   : Troy A. Manning It is certified that error appears in the above-identified patent and that said Letters Patent is hereby corrected as shown below:

Title page,
Item [63], Related U.S. Application Data, "Continuation of application No. 09/260,197, filed on Mar. 30, 1999." should read -- Continuation of application No. 09/260,197, filed on Mar. 1, 1999, now Pat. No. 6,178,133. --

Column 1,
Lines 8-9, reads "This application is a continuation of pending U.S. patent application Ser. No. 09/260,197, filed Mar. 30, 1999." should read -- This application is a continuation of U.S. patent application Ser. No. 09/260,197, filed Mar. 1, 1999, now U.S. Pat. No. 6,178,133. --

Column 2,
Line 39, reads "operator or an" should read -- operator of an --
Line 45, reads "printers and a video" should read -- printers and video --
Line 51, reads "drives floppy disk" should read -- drives, floppy disk --

Column 4,
Line 1, reads "command-address" should read -- command address --

Column 8,
Line 28, reads "of the FIG. 3." should read -- of FIG. 3. --

Column 9,
Line 12, reads "signal, and" should read -- signal, and --

Column 10,
Line 56, reads "402,404." should read -- 402, 404. --
Line 62, reads "402,404 that is coupled" should read -- 402, 404 that is coupled --

Column 11,
Line 14, reads "described, may be referred" should read -- described, it may be referred --

Column 12,
Line 48, reads "402,404 and thereby latch" should read -- 402, 404 and thereby latch --
Line 51, reads "402,404, the bank" should read -- 402, 404, the bank --

Column 14,
Line 9, reads "this aspect of present" should read -- this aspect of the present --

UNITED STATES PATENT AND TRADEMARK OFFICE
CERTIFICATE OF CORRECTION

PATENT NO. : 6,496,440 B2
DATED : December 17, 2002
INVENTOR(S) : Troy A. Manning It is certified that error appears in the above-identified patent and that said Letters Patent is hereby corrected as shown below:

Column 18,
Line 32, reads "latches the is high" should read -- latches the high --

Column 19,
Line 65, reads "406,408, the output" should read -- 406, 408, the output --

Column 22,
Line 5, reads "WLT,WLTOFF signals" should read -- WLT, WLTOFF signals --
Line 18, reads "WLEVEN,WLODD" should read -- WLEVEN, WLODD --
Line 44, reads "402,404, the number" should read -- 402, 404, the number --
Line 45, reads "802,804 are reduced" should read -- 802, 804 are reduced --
Line 56, reads "having a different" should read -- having different --

Column 23,
Line 9, reads "852,854, driving" should read -- 852, 854, driving --
Line 16, reads "WLEVEN,WLODD" should read -- WLEVEN, WLODD --
Line 43, reads "WLT,WLTOFF signals." should read -- WLT, WLTOFF signals. --
Line 48, reads "FIG. 8." should read -- FIG. 9. --

Column 24,
Line 22, reads "CLK signals" should read -- $\overline{\text{CLK}}$ signals --

Column 25,
Line 12, reads "09/104,423" should read -- 09/104,423 --

UNITED STATES PATENT AND TRADEMARK OFFICE
CERTIFICATE OF CORRECTION

PATENT NO. : 6,496,440 B2
DATED : December 17, 2002
INVENTOR(S) : Troy A. Manning It is certified that error appears in the above-identified patent and that said Letters Patent is hereby corrected as shown below:

<u>Column 28,</u>
Line 39, reads "signal for, each" should read -- signal for each --
Line 56, reads "responsive; to the" should read -- responsive to the --

Signed and Sealed this

Third Day of August, 2004

JON W. DUDAS
*Acting Director of the United States Patent and Trademark Office*